US009627582B2

(12) United States Patent
McDaniel, Jr. et al.

(10) Patent No.: US 9,627,582 B2
(45) Date of Patent: Apr. 18, 2017

(54) LIGHT-EMITTING DIODE ARCHITECTURES FOR ENHANCED PERFORMANCE

(75) Inventors: Donald L. McDaniel, Jr., North Andover, MA (US); Michael Lim, Lexington, MA (US); Michael Gregory Brown, Tyngsboro, MA (US); Scott W. Duncan, Andover, MA (US); Andrei Kazmierski, Acton, MA (US); Paul Panaccione, Newburyport, MA (US)

(73) Assignee: Luminus Devices, Inc., Woburn, MA (US)

( * ) Notice: Subject to any disclaimer, the term of this patent is extended or adjusted under 35 U.S.C. 154(b) by 0 days.

(21) Appl. No.: 13/536,276

(22) Filed: Jun. 28, 2012

(65) Prior Publication Data
US 2013/0146932 A1    Jun. 13, 2013

Related U.S. Application Data

(60) Provisional application No. 61/502,130, filed on Jun. 28, 2011.

(51) Int. Cl.
*H01L 29/22* (2006.01)
*H01L 33/38* (2010.01)
(Continued)

(52) U.S. Cl.
CPC ............. *H01L 33/38* (2013.01); *G02B 5/005* (2013.01); *G02B 21/06* (2013.01); *G03B 21/208* (2013.01); *G03B 21/2033* (2013.01); *H01L 25/0753* (2013.01); *H01L 33/145* (2013.01); *H01L 33/58* (2013.01); *G02B 21/361* (2013.01);
(Continued)

(58) Field of Classification Search
CPC ......... H01L 33/20; H01L 33/24; H01L 33/38; H01S 5/18311; H01S 5/18313; H01S 5/18316
See application file for complete search history.

(56) References Cited

U.S. PATENT DOCUMENTS 6,278,139 B1 *  8/2001  Ishikawa ................. H01L 33/14
                                                                257/103
6,831,302 B2    12/2004  Erchak et al.
(Continued)

OTHER PUBLICATIONS

International Search Report & Written Opinion mailed Sep. 17, 2012.
(Continued)

*Primary Examiner* — Matthew E Warren
(74) *Attorney, Agent, or Firm* — Wolf, Greenfield & Sacks, P.C.

(57) ABSTRACT

The present invention relates to light-emitting diodes (LEDs), and related components, processes, systems, and methods. In certain embodiments, an LED that provides improved optical and thermal efficiency when used in optical systems with a non-rectangular input aperture (e.g., a circular aperture) is described. In some embodiments, the emission surface of the LED and/or an emitter output aperture can be shaped (e.g., in a non-rectangular shape) such that enhanced optical and thermal efficiencies are achieved. In addition, in some embodiments, chip designs and processes that may be employed in order to produce such devices are described.

15 Claims, 25 Drawing Sheets

(51) Int. Cl.
  H01L 25/075 (2006.01)
  H01L 33/14 (2010.01)
  H01L 33/58 (2010.01)
  G02B 5/00 (2006.01)
  G02B 21/06 (2006.01)
  G03B 21/20 (2006.01)
  H01L 33/20 (2010.01)
  H01L 33/24 (2010.01)
  H01L 33/54 (2010.01)
  G02B 21/36 (2006.01)

(52) U.S. Cl.
  CPC .............. *H01L 33/20* (2013.01); *H01L 33/24* (2013.01); *H01L 33/54* (2013.01); *H01L 2924/0002* (2013.01)

(56) References Cited

U.S. PATENT DOCUMENTS

| | | | |
|---|---|---|---|
| 7,105,861 B2 | 9/2006 | Erchak et al. | |
| 7,166,871 B2 | 1/2007 | Erchak | |
| 7,170,100 B2 | 1/2007 | Erchak et al. | |
| 7,598,531 B2 | 10/2009 | Erchak et al. | |
| 7,692,207 B2 | 4/2010 | Erchak et al. | |
| 7,993,940 B2 | 8/2011 | Pumyea | |
| 2004/0079942 A1 | 4/2004 | Steranka et al. | |
| 2005/0087753 A1 | 4/2005 | D'Evelyn et al. | |
| 2005/0286597 A1 | 12/2005 | Mukoyama et al. | |
| 2006/0118799 A1 | 6/2006 | D'Evelyn et al. | |
| 2006/0163587 A1 | 7/2006 | Erchak et al. | |
| 2008/0048037 A1* | 2/2008 | Zhang | 235/462.01 |
| 2008/0211416 A1 | 9/2008 | Negley et al. | |
| 2009/0080489 A1* | 3/2009 | Uchida et al. | 372/50.124 |
| 2009/0218588 A1 | 9/2009 | Panaccione et al. | |
| 2010/0038670 A1 | 2/2010 | Panaccione et al. | |
| 2011/0069729 A1 | 3/2011 | Strittmatter et al. | |

OTHER PUBLICATIONS

[No Author Listed] http://www.bridgelux.com/products/, accessed Jun. 14, 2011.

* cited by examiner

LIGHT-EMITTING DIODE ARCHITECTURES FOR ENHANCED PERFORMANCE

RELATED APPLICATIONS

This application claims priority under 35 U.S.C. §119(e) to U.S. Provisional Patent Application Ser. No. 61/502,130, filed Jun. 28, 2011, and entitled "Light-Emitting Diode Architectures for Enhanced Performance," which is incorporated herein by reference in its entirety for all purposes.

FIELD OF INVENTION

Light-emitting diodes, and related components, processes, systems, and methods are generally described.

BACKGROUND

A light-emitting diode (LED) often can provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers determine the wavelength(s) of light emitted by the LED. In addition, the chemical composition of the layers can be selected to try to isolate injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

A common approach to preparing an LED is as follows. The layers of material are prepared in the form of a wafer. Typically, the layers are formed using an epitaxial deposition technique, such as metal-organic chemical vapor deposition (MOCVD), with the initially deposited layer being formed on a growth substrate. The layers are then exposed to various etching and metallization techniques to form contacts for electrical current injection, and the wafer is subsequently sectioned into individual LED chips. Usually, the LED chips are packaged.

During use, electrical energy is usually injected into an LED and then converted into electromagnetic radiation (light), some of which is extracted from the LED, for example, via an emission surface.

SUMMARY OF THE INVENTION

Light-emitting diodes, and related components, processes, systems, and methods are generally described.

In one aspect, a light-emitting device is provided. The light-emitting device comprises, in certain embodiments, a light-emitting die comprising a light-generating region and a top surface, wherein the device is configured to selectively activate a portion of the light-generating region to produce a non-rectangular active emission area during use.

In some embodiments, the light-emitting device comprises a light-emitting die comprising a light generating region and a top surface and at least one electrical contact positioned over the top surface of the light-emitting die to define an emission area having a perimeter with a non-rectangular shape.

The light-emitting device comprises, in certain embodiments, a plurality of mesas, each mesa having an emission surface; and an emission area defined by the emission surfaces of the mesas, wherein the emission area comprises a non-rectangular perimeter.

In one aspect, an optical system is provided. The optical system comprises, in certain embodiments, a light-emitting device comprising a light-emitting die comprising a light generating region and a top surface; a substantially non-rectangular emitter output aperture positioned over the top surface of the light-emitting device configured such that light emitted by the light-emitting device is transported through the emitter output aperture; and an input aperture arranged to receive light generated by the light generating region, wherein the shape of the emitter output aperture substantially corresponds to the shape of the input aperture.

In some embodiments, the optical system comprises a plurality of light-emitting dies comprising light-generating regions and top surfaces, the light-emitting dies together defining a cumulative emission area; a substantially non-rectangular emitter output aperture positioned over the top surfaces of the light-emitting dies, configured such that light emitted by the light-emitting dies is transported through the emitter output aperture; and an input aperture arranged to receive light generated by the light generating regions. In certain such embodiments, the shape of the emitter output aperture substantially corresponds to the shape of the input aperture.

Advantages, novel features, and objects of the invention will become apparent from the following detailed description of the invention when considered in conjunction with the accompanying drawings, which are schematic and which are not intended to be drawn to scale. In cases where the present specification and a document incorporated by reference include conflicting and/or inconsistent disclosure, the present specification shall control. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention.

DETAILED DESCRIPTION

The present invention relates to light-emitting diodes (LEDs), and related components, processes, systems, and methods. In certain embodiments, an LED that provides improved optical and thermal efficiency when used in optical systems with a non-rectangular input aperture (e.g., a circular aperture) is described. In some embodiments, the emission surface of the LED and/or an emitter output aperture can be shaped (e.g., in a non-rectangular shape) such that enhanced optical and thermal efficiencies are achieved. In addition, in some embodiments, chip designs and processes that may be employed in order to produce such devices are described.

Those of ordinary skill in the art are familiar with the concept of etendue. Etendue is generally a property an optical system (e.g., a projector, a spot light, etc.) which characterizes how "spread out" light emitted from the system is in area and angle. The etendue of a light source or of an optical system can be calculated as the product of the aperture area (A) and the solid angle subtended by the light emission (α). An optical system (or an element within an optical system) cannot reduce the etendue of a light source. Rather, an optical system can, at best, preserve etendue (in which case, the etendue of the image that is produced matches the etendue of the light source).

Many optical illumination systems are essentially projectors with a circular input aperture. For example, the illumination system may include a source that projects light through a circular aperture prior to the light reaching the object that is to be illuminated. Some of these optical illumination systems, such as theater spot lights and architectural or entertainment gobo projectors, can be fundamentally constrained by the optical system etendue. That is to say, the optical system etendue can limit the extent to which narrow beams of light can be projected by the optical device. Even narrow beam projectors such as search lights, tactical flashlights, and signal beacons that do not pass their light through a physical "gate" can be limited by system etendue. Such systems generally provide the most center point optical illuminance when the etendue of the light source is matched to the etendue of the optical system and when the source lumens per etendue (i.e., Lumens/A·Ω) is maximized.

Figure 1A:
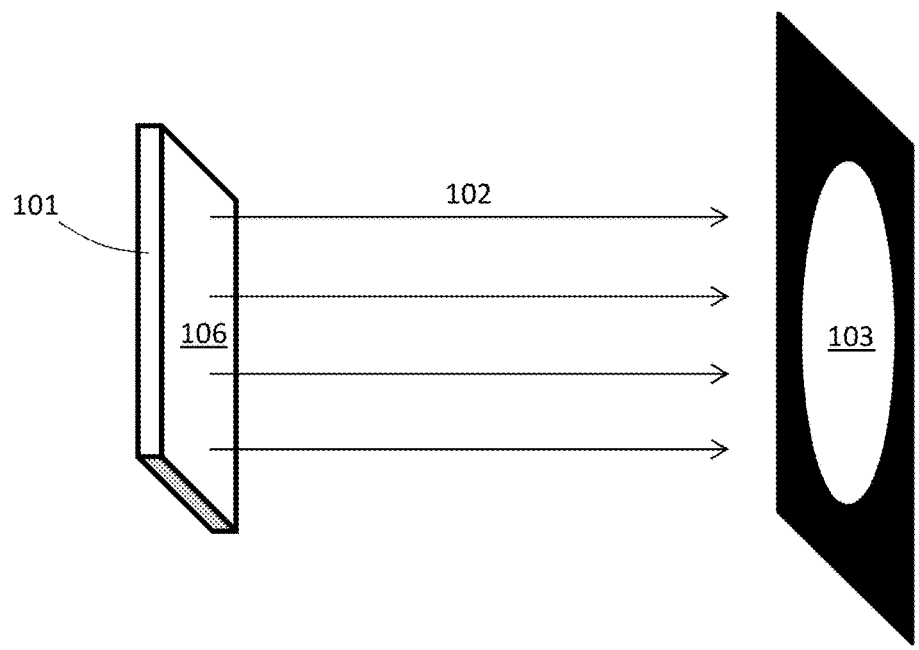
FIGS. 1A-1D are exemplary schematic illustrations of the geometries of emission surfaces and input apertures.
Figure 1B:
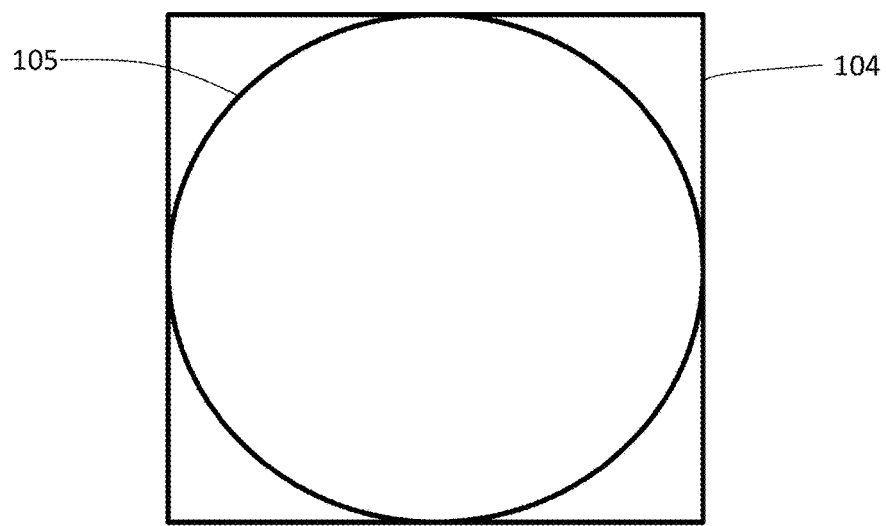
Figure 1C:
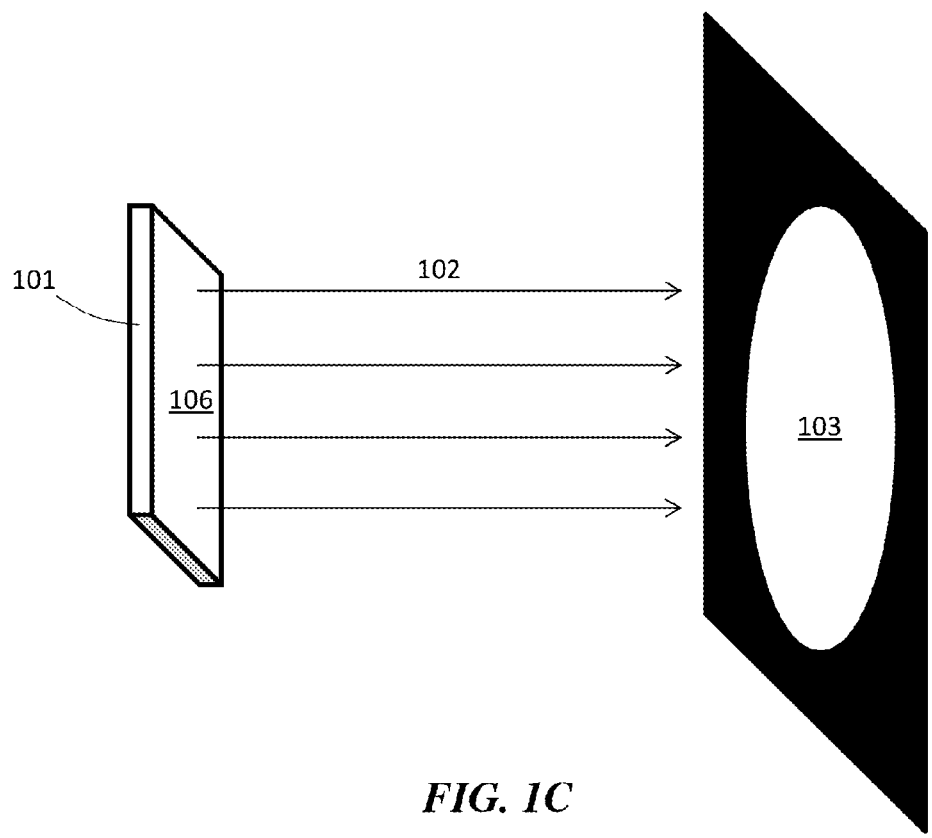
Figure 1D:
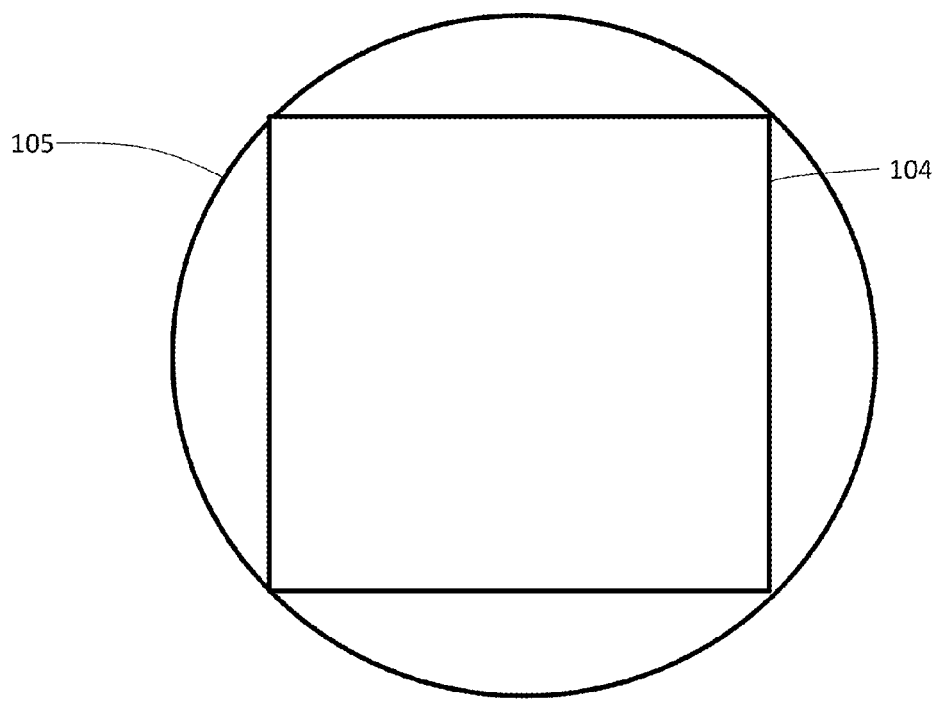

Generally, rectangular light sources, including power LEDs, are not optimized for lumens per etendue for use in systems with a circular or other non-rectangular input apertures. When considering the etendue of a rectangular light source (e.g., a power LED) that is coupled into an optical system with a circular input aperture, one can map the emitter area against the input aperture required to efficiently collect the light. FIGS. 1A-1D include schematic illustrations of two examples of comparisons of the emission surface geometry of a rectangular light source and the input aperture geometry of a circular aperture. FIGS. 1A and 1C are perspective view schematic illustrations in which square LEDs 101 are configured to produce electromagnetic radiation 102, which is emitted into a circular input aperture 103 (e.g., an opening in an opaque material). FIGS. 1B and 1D are side-view schematic illustrations of the systems, which show the overlap between the shape of the emission surface 106 of LED 101 and the shape of circular aperture 103. In FIGS. 1B and 1D, square 104 represents the emitting area of square LED 101, and circle 105 represents the shape of input aperture 103 of the optical system. In FIGS. 1A-1D, both LED dies 101 are the same size, and the optical systems are assumed to produce the same output beam angle.

In the case illustrated in FIGS. 1A-1B, the shape of circular input optical aperture 103 (corresponding to circle 105) is inscribed within the shape of square emitting area 106 (corresponding to square 104). This architecture results in a smaller optical output aperture and, hence, a smaller, less expensive optical system. Optical modules could be packed closely together where an application requires multiple sources to achieve the required output. However, in the systems illustrated in FIGS. 1A-1B, 27% of the light emitted from square emission surface 106 of LED 101 is not transmitted by aperture 103 and is lost from the system. The optical system of FIGS. 1A-1B preserves the etendue of the source (because the etendue cannot be decreased).

In the case illustrated in FIGS. 1C-1D, the shape of circular input optical aperture 103 (corresponding to circle 105) surrounds the shape of square emitting area 106 of LED 101, and therefore is able to transmit all of the light emitted from emission surface 106 (assuming the numeric aperture is appropriate). However, in order to achieve the same emitted beam angle as that of the system of FIG. 1A, a substantially larger optic (which costs more and cannot be packed as tightly in an array) would be needed. The optical system illustrated in FIGS. 1C-1D produces an increase in etendue relative to that of the source.

It has been discovered, within the context of certain embodiments of the present invention, that one can produce systems in which a relatively large amount of the light emitted by the LED is transmitted through the input aperture while preserving the etendue of the source by controlling the shape of the emission area of an LED (or other light source). In some embodiments, the amount of light produced by the source that enters into an input aperture (e.g., a non-rectangular input aperture such as a circular input aperture) can be increased, for example, by employing a light source with a non-square or non-rectangular (e.g., a non-quadrilateral) emission surface.

As used herein, the input aperture (also referred to as the aperture stop) is an aperture that generally physically limits the solid angle of light rays that pass through the system, and can limit the brightness of the image. In certain embodiments, the input aperture is a transparent hole within an opaque material. In some embodiments, the input aperture is the reflective surface area defined by a microdisplay. In other embodiments, the input aperture can be the surface of a lens, waveguide, a profile gate, framing shutters, or other optical component that is arranged to receive light emitted by the LED. In some embodiments, the input aperture can be the object that is to be imaged (e.g., a microscope specimen), for example, when the LED is used in a critical illumination system and/or a Kohler illumination system, as described in more detail below. In some embodiments, the input aperture corresponds to the input of an optical element.

Figure 1E:
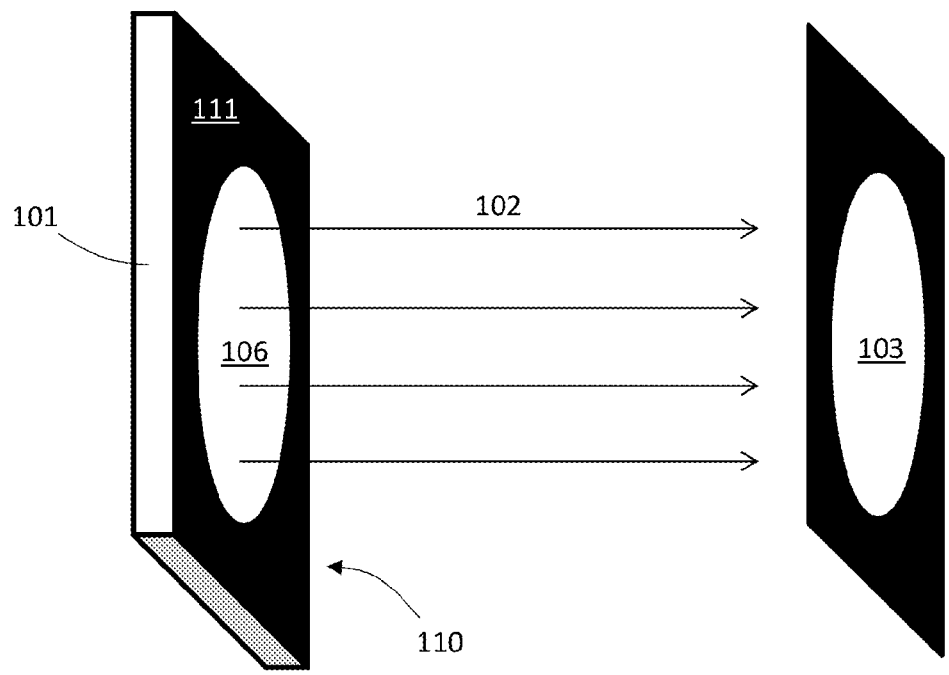
FIGS. 1E-1H are perspective view schematic illustrations of optical systems, according to one set of embodiments.

FIG. 1E is a perspective view schematic illustration of a system in which an LED 101 comprising a non-rectangular emission surface 106 is employed. In FIG. 1E, LED 101 comprises a top surface 110. Portion 111 of top surface 110 can be configured such that light is not emitted out of the LED through portion 111, using any of a variety of techniques, alone or in combination with each other, described in more detail below. In the set of embodiments illustrated in FIG. 1E, configuring LED 101 such that light is not emitted out of portion 111 creates a substantially circular emission surface 106. In FIG. 1E, the shape of emission surface 106 substantially corresponds to the shape of input aperture 103, which can ensure that a relatively large amount of the light emitted by LED 101 is transmitted through the input aperture while preserving the etendue of LED 101. While a circular emission surface 106 is illustrated in FIG. 1E, in other embodiments, emission surfaces with other non-rectangular shapes can also be used, as described in more detail below.

The emission surface of an LED generally refers to the area of the LED from which light generated by the light-generating region of the LED is emitted out of the LED. As one example, the emission surface of an LED could be the same shape as the LED die. For example, the emission surface can be the top surface of the LED die through which light generated by the light-generating region of the LED is emitted, as is illustrated in FIGS. 1A and 1C. In other cases, the emission surface can have a shape that is different than the shape of the LED die.

In some embodiments, the shape of the emission surface of the LED can be non-rectangular and can be defined by one or more features positioned over the top surface of the die. Such embodiments can be useful, for example, in cases where the LED die is square or otherwise rectangular, and it is desired to create an emission surface of the LED that is non-rectangular (e.g., curved, 5-sided or greater polygonal (regular or irregular), etc.).

The emission surface of an LED is said to be defined by a feature when the feature alters the shape of the light emitted from the LED surface, relative to the shape of the light that would be emitted from the LED in the absence of the feature. For example, an opaque electrical contact that does not allow light to be transmitted through it or diffracted around it would be said to define an emission surface. On the other hand, an opaque electrical contact in the form of a relatively thin wire which merely diffracts the light emitted from the LED such that the shape of the light emitted from the LED is not altered would not be said to define an emission surface.

A variety of techniques can be used to produce an emission surface having a desired shape (e.g., a non-rectangular shape) that is not substantially similar to the shape of the LED die. In some embodiments, opaque materials (e.g., electrical contacts) that do not substantially transmit light are positioned over (e.g., directly on) the top surface of the LED die. In such cases, the emission surface of the LED would not include the portions of the top surface of the LED that are covered by the opaque material. In some such cases, the emission area can correspond to the area that is not covered by the opaque material, assuming emission through the non-doped regions is not otherwise prevented. As a specific example, referring back to FIG. 1E, region 111 can comprise an opaque material (e.g., one or more electrical contacts) positioned over surface 110 such that emission surface 106 remains uncovered.

As another example, the LED might include a top surface in which one or more regions of the top surface have been doped to reduce their electrical conductivities such that current is injected into (and light is emitted out of) the LED only through non-doped regions. In such cases, the emission surface would not include the doped areas of the top surface of the LED. In some such cases, the emission area can correspond to the area occupied by the non-doped regions, assuming emission through the non-doped regions is not otherwise prevented (e.g., by covering the non-doped regions with an opaque material). As one specific example, referring back to FIG. 1E, region 111 of top surface 110 can be doped such that the material within region 111 is incapable of substantially conducting electricity, while the area within emission surface 106 remains undoped.

As yet another example, the LED might include non-ohmic materials positioned between electrical contacts and the top surface of the LED, which can prevent current from being transferred from the electrical contacts through the LED. In such cases, the emission surface would not include the areas of the top surface that are covered by the non-ohmic material. In some such cases, the emission area can correspond to the areas that are not covered by non-ohmic materials, assuming emission through the uncovered regions is not otherwise prevented (e.g., by doping or by covering with an opaque material). As a specific example, referring back to FIG. 1E, non-ohmic material can be positioned over region 111 of top surface 110 such that electricity cannot be transferred through region 111 is incapable of substantially conducting electricity, while the area within emission surface 106 remains uncovered. In such an embodiments, when an electric potential is applied across LED 101, current will be transported only through region 106, and, thus, light will be emitted only through region 106.

It has also been discovered, within the context of certain embodiments of the present invention, that one can control the shape of the light emitted by a source by positioning a packaging layer comprising an aperture (referred to herein as the emitter output aperture) over the emission surface of the LED. In this way, the shape of the light being emitted by the LED can be altered such that it substantially corresponds to the shape of an input aperture downstream of the emitter output aperture.

Figure 1F:
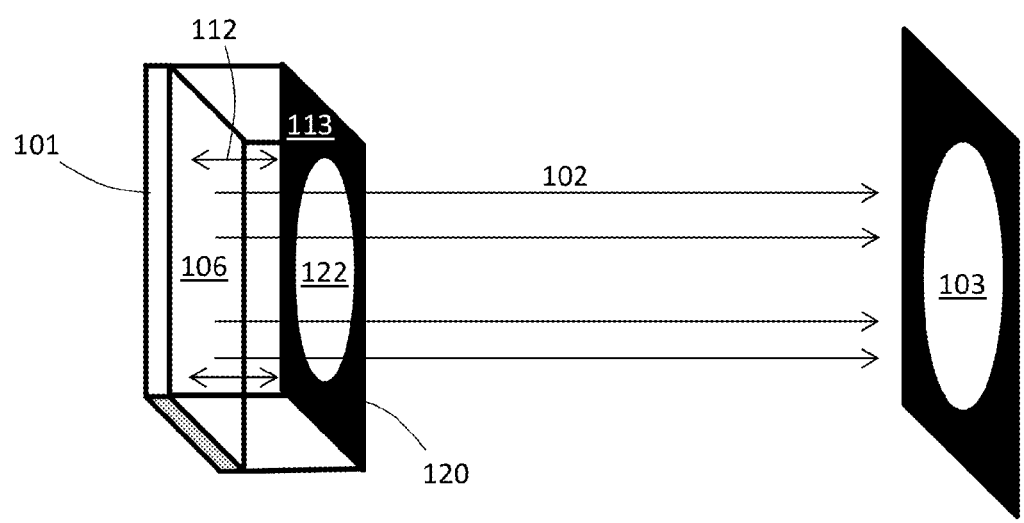

FIG. 1F is a perspective view illustration of a system in which an emitter output aperture is employed. In FIG. 1F, LED 101 comprises a substantially rectangular emission surface 106. LED package layer 120, which is positioned over emission surface 106, includes emitter output aperture 122, which is circular in shape. During operation, portion 102 of the electromagnetic radiation emitted by LED 101 is transmitted through aperture 103. In certain embodiments, portion 112 can be reflected by material 113 back toward emission surface 106. Such reflection can be achieved when material 113 is a reflective material such as a metal. By arranging emitter output aperture 122 proximate LED 101, a circular emission profile can be created from substantially rectangular emission surface 106.

In certain embodiments, the emitter output aperture and the top surface of the LED can be positioned relatively close to one another. In some embodiments, the shortest distance between the emitter output aperture and a light-emitting die is less than about 1 centimeter, less than about 1 millimeter, less than about 500 microns, or less than about 100 microns. In certain embodiments, positioning the emitter output aperture close to the LED can reduce the amount of light that is lost from the system.

The emission surface of the LED and/or the emitter output aperture associated with the LED can be configured to have any desirable shape. As one particular example, a light-emitting diode with a circular emission surface could be used (e.g., in a system with a circular input aperture), such as emissions surface 106 illustrated in FIG. 1E. In some embodiments, a substantially circular emitter output aperture can be associated with the LED, such as emitter output aperture 122 illustrated in FIG. 1F.

It should be understood that the invention is not limited to the use of circular emission surfaces and circular emitter output apertures, and that improved performance can also be achieved using other non-square emission surface shapes and/or other non-square emitter output aperture shapes (including non-rectangular emission surface shapes and/or non-rectangular emitter output aperture shapes). In some embodiments, the light-emitting diode can include an emission surface and/or an emitter output aperture having a shape that, while not perfectly circular, is substantially circular. In some embodiments, the light-emitting diode can include an emission surface and/or an emitter output aperture that has an elliptical shape, an ellipsoidal shape, or a shape that otherwise includes curved edges.

In some embodiments, the emission surface of the light-emitting diode and/or an emitter output aperture associated with a light-emitting diode can be in the shape of a polygon with at least 5 sides (e.g., a polygon with at least 6, at least 7, at least 8, at least 9, at least 10, at least 15, at least 20, at least 50, or at least 100 sides). In some embodiments, the emission surface and/or emitter output aperture of the light-emitting diode can include fewer than 1000 or fewer than 100 sides. Not wishing to be bound by any particular theory, it is believed that the use of an emitter including a polygonal emission surface having 5 or more sides and/or emitter output aperture can approximate the effect observed in systems employing circular emission surface geometries, with a greater number of polygon sides more closely approximating the performance of a circular emission surface. In some embodiments in which the shape of the emission surface and/or emitter output aperture is polygonal, the polygon can be a substantially regular polygon.

Figure 1G:
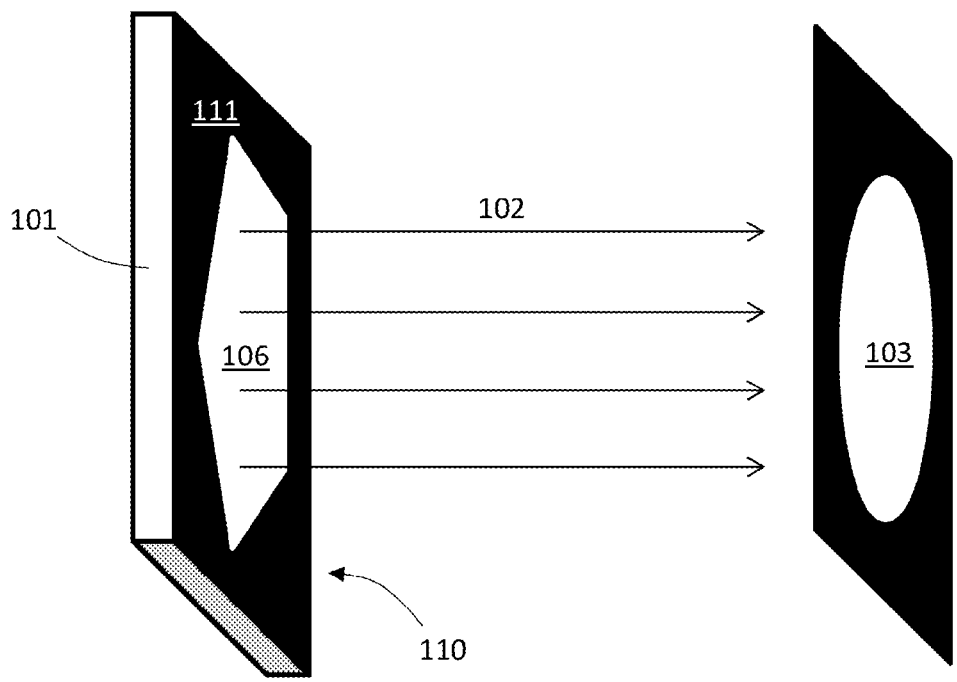
Figure 1H:
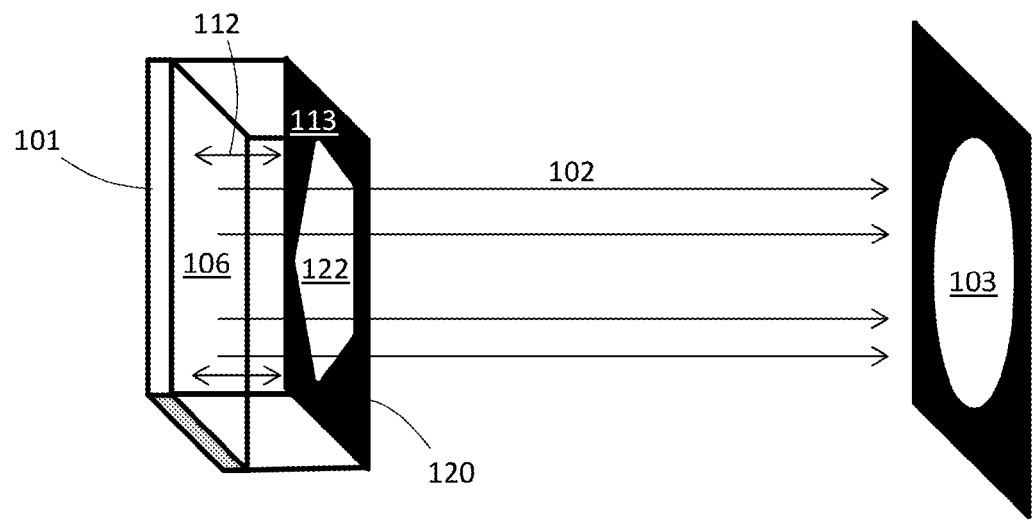

As one example, FIG. 1G is a perspective view schematic illustration of a system in which LED 101 includes an emission surface in the shape of a five-sided polygon. Specifically, emission surface 106 in FIG. 1G is a substantially regular pentagon. FIG. 1H is a perspective view schematic illustration of a system in which emitter output aperture 122 is in the shape of a substantially regular pentagon. Not wishing to be bound by any particular theory, it is believed that the use of emission surfaces and/or emitter output apertures with substantially regular polygonal shapes more closely approximates the use of devices that have circular emission surfaces. Of course, it should be understood that the invention is not limited to the use of emission surfaces and emitter output apertures in the shape of substantially regular polygons, and, in other embodiments, the emission surface can be in the shape of an irregular polygon.

In some embodiments, the shape of the emission surface of the LED and/or the shape of the emitter output aperture associated with the LED can substantially correspond to (i.e., have substantially the same shape as) the shape of the input aperture of an optical system in which the LED is used. For example, in each of the embodiments illustrated in FIGS. 1E and 1G, the shape of emission surface 106 substantially corresponds to the shape of input aperture 103. In addition, in each of the embodiments illustrated in FIGS. 1F and 1H, the shape of emitter output aperture 122 substantially corresponds to the shape of input aperture 103.

Determining whether the shapes of two objects substantially correspond to each other (e.g., to determine whether the shape of the input aperture and the shape of the emission surface substantially correspond to each other, or to determine whether the shape of the input aperture and the shape of the emitter output aperture substantially correspond to each other) is generally performed as follows. First, one arranges the shapes that are to be compared over each other such that overlap is maximized. Maximizing the overlap of two shapes may involve increasing the size of the smaller shape relative to the size of the larger shape while maintaining the aspect ratio and general shape of the smaller shape (e.g., in cases where the input aperture is a different size (e.g., larger) than the emission surface or the emitter output aperture). For example, a perfect circle with a 1 mm diameter would completely overlap a perfect circle with a 10 mm diameter because the size of the 1-mm diameter circle can be increased (while maintaining the aspect ratio and general shape of the 1-mm diameter circle) such that it completely overlaps the 10-mm diameter circle. The 1-mm diameter circle and the 10-mm diameter circle would be said to have a percentage overlap of 100%, as described below.

Next, one determines the total surface area of the overlapping portions and the total surface areas of the non-overlapping portions. The percentage overlap is then generally calculated as follows:

$$\% \text{ Overlap} = \frac{A_{Overlap}}{A_{Overlap} + A_{Non\text{-}Overlap}} \times 100\%$$

where $A_{Overlap}$ corresponds to the surface areas of the compared objects that overlap and $A_{Non\text{-}Overlap}$ corresponds to the surface areas of the compared objects that do not overlap. The shapes are considered to substantially correspond to each other if the percentage overlap is at least about 90%, in certain embodiments. In some embodiments, two objects that have shapes that substantially correspond to each other have a percentage overlap of at least about 95%, at least about 99%, or substantially 100% (e.g., in the case of two substantially circular objects).

Figure 1I:
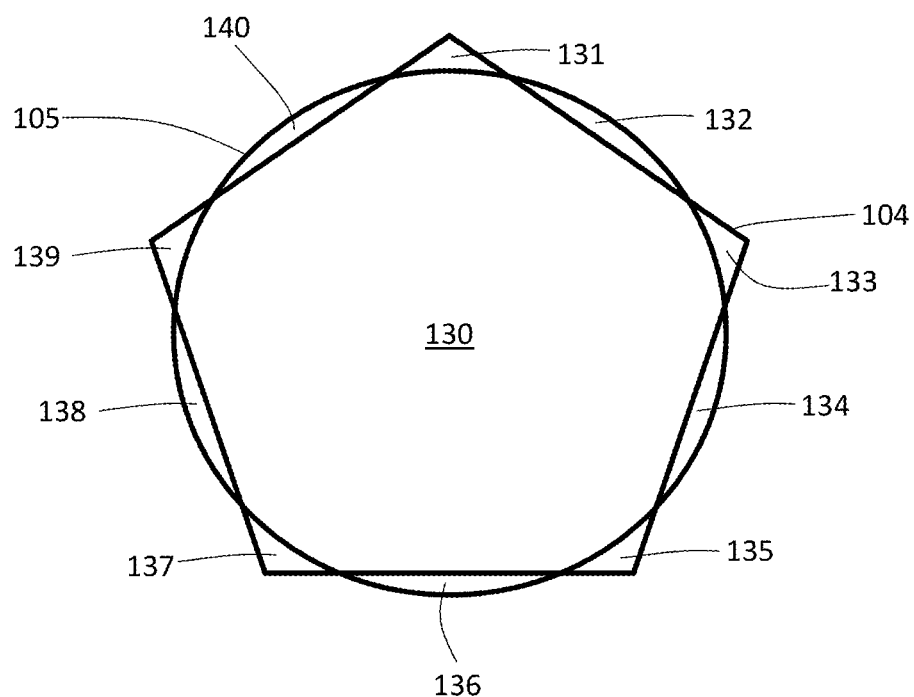
FIG. 1I is a schematic illustration showing the overlap of an emission surface shape and an input aperture shape, according to some embodiments.

The method of determining whether two shapes substantially correspond to each other is further illustrated with respect to FIG. 1I. In FIG. 1I, emission surface shape 104 has been arranged over input aperture shape 105 such that the area of overlap 130 between shapes 104 and 105 has been maximized. To calculate the percentage of overlap between shapes 104 and 105, the area of region 130 would be divided by the sum of the areas of regions 130, 131, 132, 133, 134, 135, 136, 137, 138, 139, and 140. In mathematical terms:

$$\% \text{ Overlap} = \frac{A_{130}}{A_{130} + A_{131} + A_{132} + A_{133} + A_{134} + A_{135} + A_{136} + A_{137} + A_{138} + A_{139} + A_{140}} \times 100\%$$

In FIG. 1I, the percentage overlap is greater than 90%. Accordingly, shapes 104 and 105 in FIG. 1I substantially correspond to each other.

The emission surface of the LED, the emitter output aperture associated with the LED, and/or the input aperture of the optical system in which the LED is used can each assume a variety of shapes. In certain embodiments, a light-emitting diode with a substantially circular emission surface and/or a substantially circular emitter output aperture can be used in a system with a substantially circular input aperture. Replacing a square emission surface with a circular emission surface matched to the input aperture increases the coupled emitting area by a factor of 4/pi (or 1.27), assuming constant flux density across the emitter's surface. This circular geometry can increase lumens/etendue for the system. Similar lumens/etendue could be achieved by using an oversized die as in FIG. 1A, but the power used to generate the uncollected light would be wasted resulting in a lower value for lumens/(etendue·watt). Furthermore, the reduced power dissipation allows a smaller thermal system and/or lower operating temperature of the LED which can further increase source efficacy. Given that LED systems are generally thermally limited for output and lifetime, optimizing lumens/(etendue·watt) can confer substantial system benefits.

In some embodiments, the input aperture of the system can be polygonal (e.g., a substantially regular polygon) having n sides and the active emission surface of the LED and/or the emitter output aperture associated with the LED can be polygonal (e.g., a substantially regular polygon) having n sides (e.g., where n is at least 5).

In certain embodiments, the input aperture of the system can be substantially circular and the emission surface of the LED and/or the emitter output aperture can be polygonal (e.g., a substantially regular polygon) having n sides, wherein n is at least 5. For example, in FIG. 1G, input aperture 103 is substantially circular while emission surface 106 of LED 101 is polygonal (having five sides). In FIG. 1H, input aperture 103 is substantially circular while emitter output aperture 122 is polygonal (having five sides).

While several embodiments have been described in which various materials (e.g., opaque materials such as electrical contacts, doped materials, and the like) are used to define the emission surface of the LEDs described herein, it should be understood that non-rectangular emission surfaces can also be created by processing the light-emitting die such that the die itself has a desired emission surface shape. In some such embodiments, the shape of the LED die can substantially correspond to the shape of the emission surface. For example, in some embodiments, the LED die can be non-rectangular (e.g., having a shape corresponding to any of the shapes of the emission surfaces described elsewhere herein). In some embodiments, the LED die can be curved (e.g., circular, substantially circular, elliptical, ellipsoidal, or otherwise curved), polygonal with at least 5 sides, or any other shape described herein. While such dies can be used in the systems and methods described herein, their use is often not preferred because fabricating non-rectangular dies can be prohibitively expensive and complicated, in many instances.

Figure 2:
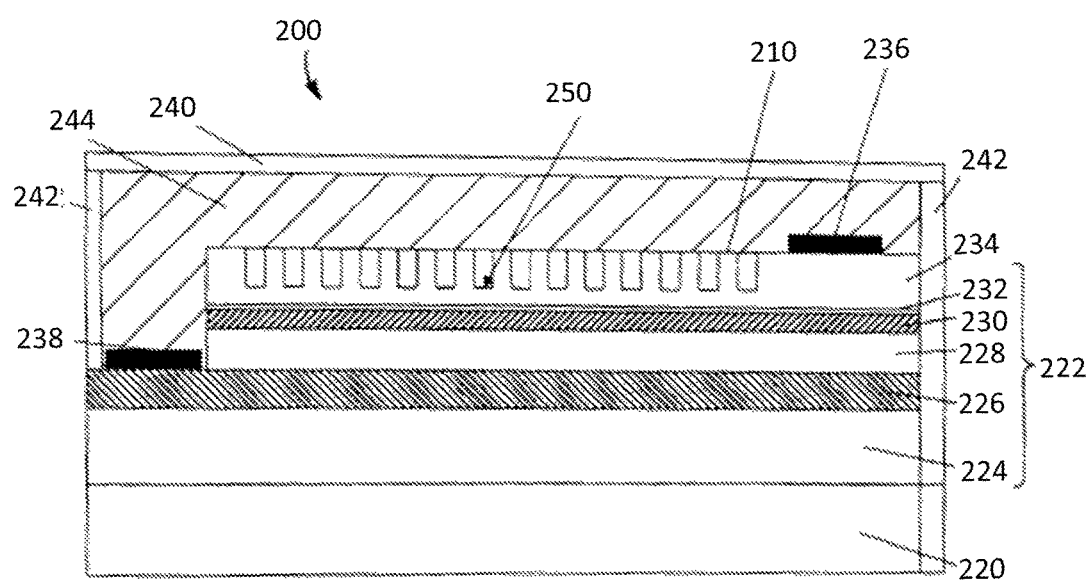
FIG. 2 is an exemplary cross-sectional schematic illustration of an LED.

FIG. 2 includes an exemplary cross-sectional schematic illustration of LED 200 in the form of a packaged die, which can be used in accordance with certain embodiments described herein. In FIG. 2, LED 200 includes a multi-layer stack 222 disposed on a submount 220. As illustrated, multi-layer stack 222 includes a 320 nm thick silicon doped (n-doped) GaN layer 234 having a pattern of openings 250 in its upper surface 210. Multi-layer stack 222 also includes, in FIG. 2, a bonding layer 224, a 100 nm thick silver layer 226, a 40 nm thick magnesium doped (p-doped) GaN layer 228, a 120 nm thick light-generating region 230 formed of multiple InGaN/GaN quantum wells, and a AlGaN layer 232. In FIG. 2, an n-side contact pad 236 is disposed on layer 234, and a p-side contact pad 238 is disposed on layer 226. As illustrated, an encapsulant material (e.g., epoxy having an index of refraction of 1.5) 244 is present between layer 234 and a cover slip 240 and supports 242. In FIG. 2, layer 244 does not extend into openings 250.

Light can be generated by LED 200 as follows. P-side contact pad 238 can be held at a positive potential relative to n-side contact pad 236, which can cause electrical current to be injected into LED 200. As the electrical current passes through light-generating region 230, electrons from n-doped layer 234 can combine in region 230 with holes from p-doped layer 228, which can cause region 230 to generate light. Light-generating region 230 can contain a multitude of point dipole radiation sources that emit light (e.g., isotropically) within the region 230 with a spectrum of wavelengths characteristic of the material from which light-generating region 230 is formed. For InGaN/GaN quantum wells, the spectrum of wavelengths of light generated by region 230 can have a peak wavelength of about 445 nanometers (nm) and a full width at half maximum (FWHM) of about 30 nm.

It is to be noted that the charge carriers in p-doped layer 228 generally have relatively low mobility compared to the charge carriers in the n-doped semiconductor layer 234. As a result, placing silver layer 226 (which is conductive) along the surface of p-doped layer 228 can enhance the uniformity of charge injection from contact pad 238 into p-doped layer 228 and light-generating region 230. This can also reduce the electrical resistance of device 200 and/or increase the injection efficiency of device 200. Because of the relatively high charge carrier mobility of the n-doped layer 234, electrons can spread relatively quickly from n-side contact pad 236 throughout layers 232 and 234, so that the current density within the light-generating region 230 is substantially uniform across the region 230. It is also to be noted that silver layer 226 has relatively high thermal conductivity, allowing layer 226 to act as a heat sink for LED 200 (to transfer heat vertically from the multi-layer stack 222 to submount 220).

At least some of the light that is generated by region 230 can be directed toward silver layer 226. This light can be reflected by layer 226 and emerge from LED 200 via surface 210, or can be reflected by layer 226 and then absorbed within the semiconductor material in LED 200 to produce an electron-hole pair that can combine in region 230, causing region 230 to generate light. Similarly, at least some of the light that is generated by region 230 can be directed toward pad 236. The underside of pad 236 can be formed of a material (e.g., a Ti/Al/Ni/Au alloy) that can reflect at least some of the light generated by light-generating region 230. Accordingly, the light that is directed to pad 236 can be reflected by pad 236 and subsequently emerge from LED 200 via surface 210 (e.g., by being reflected from silver layer 226), or the light that is directed to pad 236 can be reflected by pad 236 and then absorbed within the semiconductor material in LED 200 to produce an electron-hole pair that can combine in region 230, which can cause region 230 to generate light (e.g., with or without being reflected by silver layer 226).

In some embodiments, emitting surface 210 of the LED has a dielectric function that varies spatially which can improve the extraction efficiency of light generated by the LED and may enable the high power levels described further below. For example, the dielectric function can vary spatially according to a pattern. The pattern may be periodic (e.g., having a simple repeat cell, or having a complex repeat super-cell), periodic with de-tuning, or non-periodic. Examples of non-periodic patterns include quasi-crystal patterns, for example, quasi-crystal patterns having 8-fold symmetry. In certain embodiments, the emitting surface is patterned with openings which can form a photonic lattice. Suitable LEDs having a dielectric function that varies spatially (e.g., a photonic lattice) have been described in, for example, U.S. Pat. No. 6,831,302 B2, entitled "Light Emitting Devices with Improved Extraction Efficiency," filed on Nov. 26, 2003, which is herein incorporated by reference in its entirety.

In some embodiments, performance can be enhanced by placing cover slip 240 close to the top surface of the LED or by eliminating the cover slip 240 from the LED package. In some embodiments, performance can be enhanced by replacing encapsulant material 244 with air such that the LED emits directly into air.

While the LED shown in FIG. 2 is illustrated as having the n-side contact pad 236 on the top of the LED and the p-side contact pad 238 is on the bottom of the LED, it should be understood that the LED in FIG. 2 is merely illustrative and that, in other embodiments (e.g., in embodiments in which the LED is fabricated according to a flip-chip process), the p-side contact pad may be on top.

Specific methods of creating emission areas with desired shapes are now described.

As noted above, in some embodiments, the emission surface can be constructed to have a different shape than the shape of the light-emitting die by covering a portion of the top surface of the LED with an opaque material that does not permit substantial transmission of light through the material, thereby defining a non-rectangular area through which light is emitted. In some embodiments, the covering material can be reflective such that at least a portion of the light generated by the LED that is incident upon the covering material is reflected back into the LED.

In some embodiments, the material used to cover a portion of the top surface of the LED can be the top-side electrical contact. For example, in some embodiments, the top side electrical contact (e.g., the n-side contact pad 236 in the LED of FIG. 2 and/or a p-side contact pad in an LED fabricated according to a flip-chip method) can cover a portion of the top surface of the LED to define a non-rectangular emission region (e.g., having any of the non-rectangular emission surface shapes described herein) through which light generated by the LED can be emitted. In the set of embodiments illustrated in FIG. 2, for example, the n-side ohmic contact can be constructed such that the percentage coverage is maintained or reduced going from the edge of the device toward the center of the device. In some embodiments, the material used to cover a portion of the top surface of the LED can be used as bond-pads for the packaging process (e.g., for wire-bonds or flip chip connections).

Figure 3A:
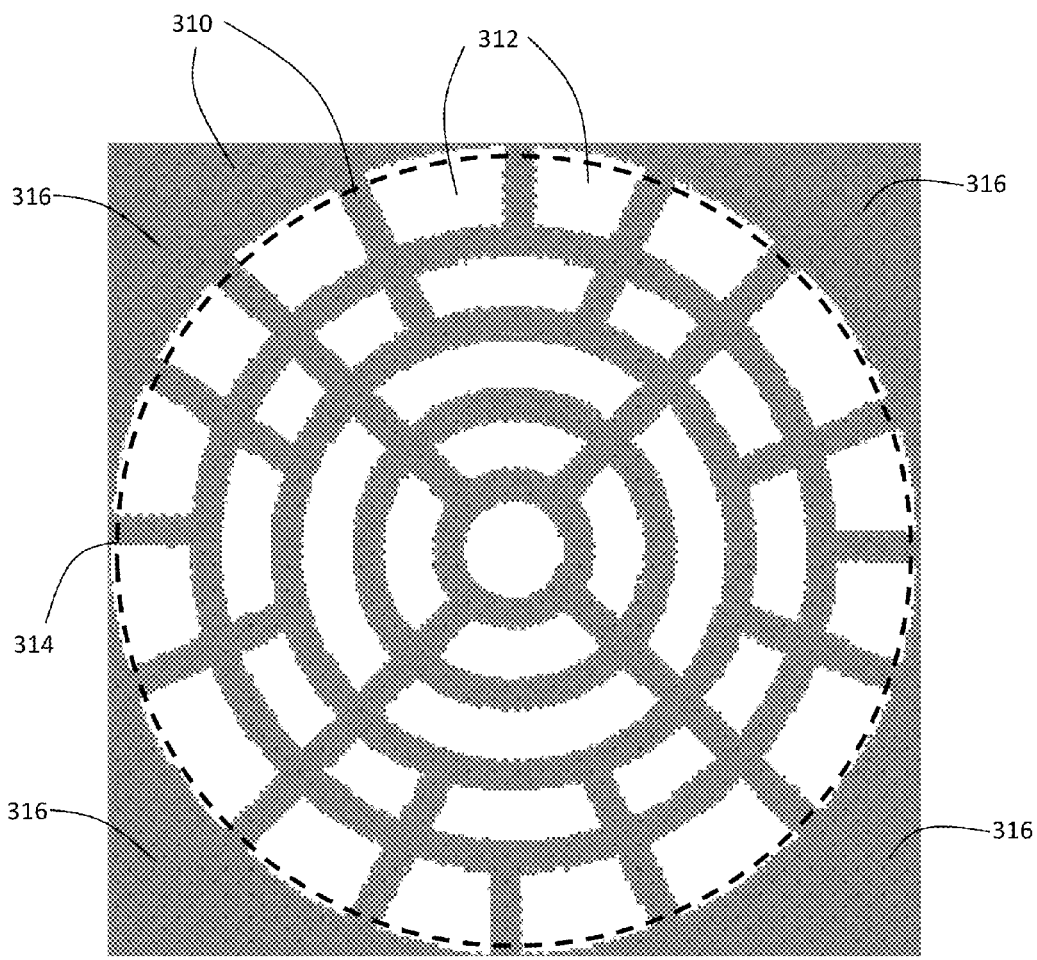
FIGS. 3A-3C are schematic illustrations of electrode layouts for LEDs, according to some embodiments.
Figure 3B:
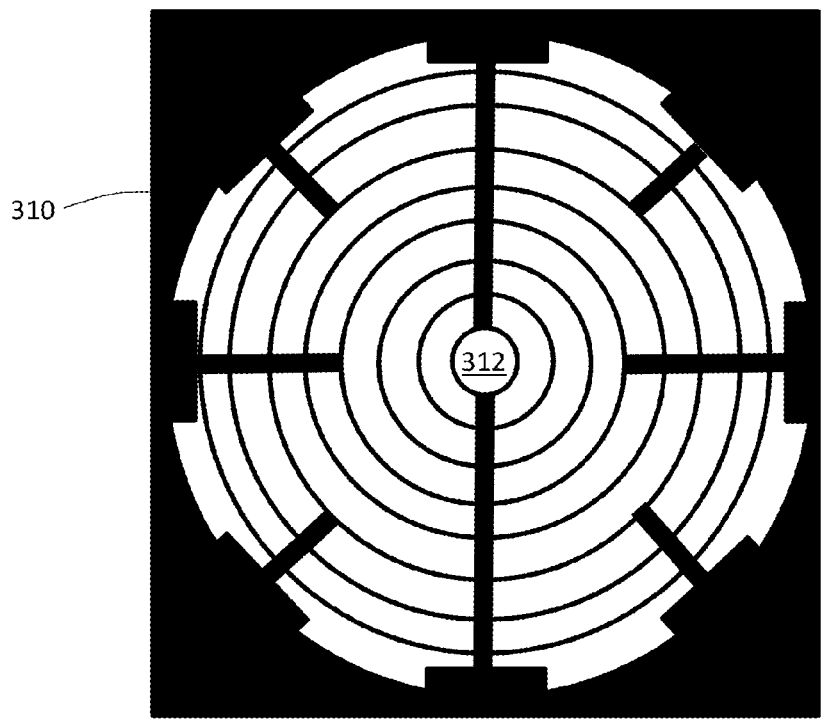
Figure 3C:
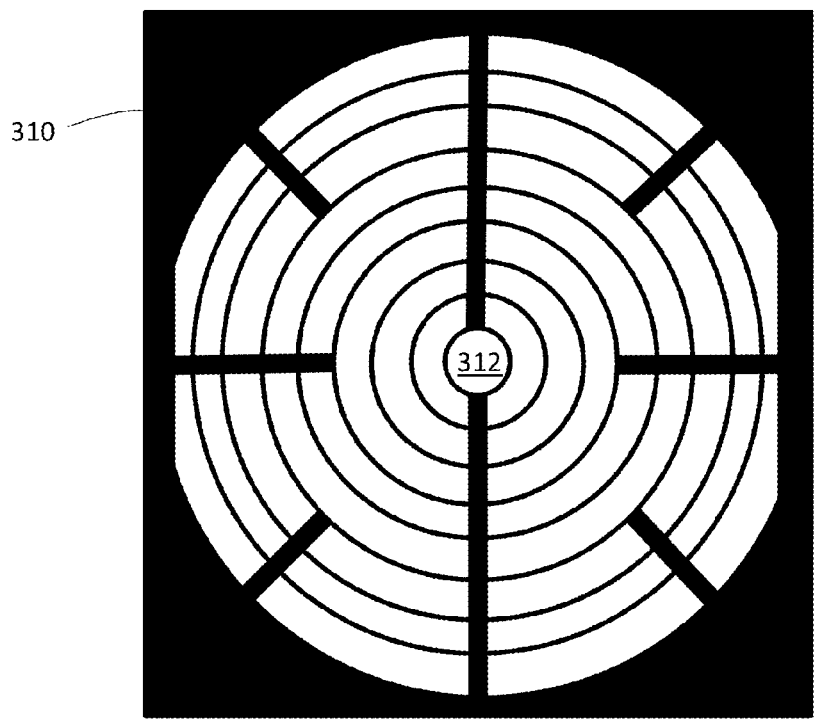

FIGS. 3A-3C include exemplary schematic illustrations of LED top surface configurations in which a non-transmissive material is used to cover a portion of the top surface of the LED. In the set of embodiments illustrated in FIG. 3A, non-transmissive material covers portions 310. On the other hand, in FIG. 3A, portions 312 are left exposed such that light can be emitted through them. In FIG. 3A, portions 310 define a substantially circular emission surface, the boundaries of which are indicated by dotted line 314. Despite the presence of non-transmissive material within the boundaries of emission surface 314, the emission surface would remain substantially circular because light can be diffracted around the portions of the non-transmissive material within the dotted line of FIG. 3A.

Another way in which the emission surface of the LED can be constructed to have a different shape than the shape of the LED die is to fabricate the LED such that only a desired emitting area (e.g., circular, polygonal, etc.) is active. This can be achieved, for example, by configuring the light-emitting device to selectively activate a portion of the light-generating region to produce a non-rectangular active emission area during use. Selectively activating a portion of the light-generating region can be accomplished, for example, by arranging the electrodes and/or underlying non-ohmic material such that current is supplied predominantly to the portions of the epitaxial layers within the desired emission area. Selectively activating a portion of the light-generating region can also be accomplished, for example, by doping a portion of the top layer of the LED such that electricity cannot be substantially conducted through the doped portion, thereby forcing the electricity to be conducted through the non-doped portion. In each of these methods, the flow of electricity through the LED can be controlled such that the light-generating region is activated only under a portion of the top layer of the LED (e.g., layer 234 in FIG. 2). When only a portion of the light-generating region is activated, the light will generally emerge from the LED having substantially the same shape as the portion of the light-generating region that has been activated. Thus, by controlling the shape of the light-generating region that is activated, one can control the shape of the emission surface of the LED and, accordingly, the shape of the light output by the LED. In certain instances, systems and methods that make use of selective activation of the light-generating layer can be more efficient than systems and methods in which light emission from the LED is blocked (e.g., via an opaque material).

In such embodiments, the portions of the top layer of the LED through which electricity is not transported are said to be "unpumped." While the unpumped area may be seen as "wasted epi," with careful design, some of the unpumped area can be used as a bonding area, which would otherwise be taken up along the edges of a standard rectangular die in any case. Furthermore, for some applications (e.g., some critical high performance applications), the drawback of including an unpumped area is justified by the thermal and optical performance enhancement of the design.

In some embodiments, the current injection in the LED can be controlled such that a relatively large amount (e.g., most or substantially all) of the current is injected through a non-rectangular portion of the top surface of the LED. For example, in embodiments in which a circular emission surface is desired, the current injection into the LED can be controlled such that most of the current that is injected into the LED is injected within the outer boundaries of a circular emission region (e.g., the region including and within dotted line 314 in FIG. 3A). When current is injected in this way, only a portion of the underlying light-generating region is activated, and therefore, light is only emitted through a portion of the top surface of the LED, thereby defining a non-rectangular emission area.

In some embodiments, the injection of current into the LED can be controlled by incorporating layers of non-ohmic material (also referred to as current-blocking layers) that block current from flowing from the electrodes to portions of the top surface of the LED adjacent the electrodes. A variety of non-ohmic materials can be used for this purpose. In certain embodiments, the non-ohmic material has a lower electrical conductivity (i.e., higher resistivity) than that of the conductive electrodes formed over the non-ohmic material. In some cases, non-ohmic material may include insulators such as oxides and nitrides (e.g., silicon oxide and silicon nitride). In other cases, the non-ohmic material may include Schottky metals (i.e., Schottky contact materials). Suitable Schottky metals may depend on the material used to form the conductive electrodes and/or the particular material used to form the top surface of the LED (e.g., n-doped layer 234 in FIG. 2). For example, a top surface formed of GaN may include contact members with non-ohmic portions comprising indium-tin oxide (ITO). In some embodiments, current blocking layers can be formed using a dielectric material.

In certain embodiments, the non-ohmic material can be positioned underneath (e.g., directly underneath) portions of the top side ohmic contact (e.g., n-type contact 236 in FIG. 2) in regions where current transfer to the top surface of the LED are undesired, such as regions near the outside edges of the LED. Arranging the dielectric material in this way can force current to the center of the LED. In the set of embodiments illustrated in FIG. 3A, for example, a dielectric material can be formed underneath the top-side ohmic contact in the regions under corners 316, which can force current to be injected into the LED only within region 314.

In some embodiments, current blocking layers can be formed underneath (e.g., directly underneath) the bottom-side ohmic contact (e.g., p-type contact 238 in FIG. 2) by including a region formed underneath the bottom-side ohmic contact. For example, a p-ohmic disruption (POD) can be formed underneath a bottom side p-type contact, which can force current to spread more efficiently.

In certain embodiments, current flow through the LED can be controlled by controlling the shape of the electrode opposite the emission surface of the LED (e.g., electrode 238 in FIG. 2). For example, in certain embodiments, the electrode opposite the emission surface of the LED can be non-rectangular (e.g., substantially circular, elliptical, polygonal with 5 or more sides, or any other of the non-rectangular shapes described herein). When non-rectangular bottom electrodes are used, the current can be shaped such that it is transported through the top layer according to the same non-rectangular shape. For example, if the bottom electrode is substantially circular, the electrical current is generally transported through the LED in the shape of a cylinder, which can result in a substantially circular active emission area.

As another example, partial activation of the light-generating region can be achieved by selectively implanting ions into the n-type layer, the light generating layer, and/or the p-type layer to laterally isolate at least one light-generating region from the other portions of the LED. For example, referring back to FIGS. 3A-3C, in certain embodiments, ions can be implanted into the n-type layer, the light generating layer, and/or the p-type layer underneath portions 310 such that current cannot be injected through the portions of the n-type layer, the light generating layer, and/or the p-type layer lying underneath portions 310. This can force electrical current through portions 312 of the LED, thereby defining a non-rectangular active emission surface.

The activated emission areas (e.g., formed by confining the areas over which current is injected into the LED) can have any of the non-rectangular shapes described herein (e.g., circular, substantially circular, elliptical, ellipsoidal, otherwise curved, polygonal with 5 or more sides, etc.).

In some embodiments, rather than controlling current by activating only a portion of the light-generating region, a portion of the n-type layer (e.g., layer 234 in FIG. 2), the light generating region (e.g., region 230 in FIG. 2), and/or the p-type layer (e.g., layer 228 in FIG. 2) can be physically removed such that one or more laterally isolated light-generating regions are formed. This can involve, for example, etching the n-type layer, the light-generating layer, and/or the p-type layer to form one or more laterally separated, individual light-generating mesas. The mesas can have any of the non-rectangular shapes described herein (e.g., circular, substantially circular, elliptical, ellipsoidal, otherwise curved, polygonal with 5 or more sides, etc.).

Figure 4A:
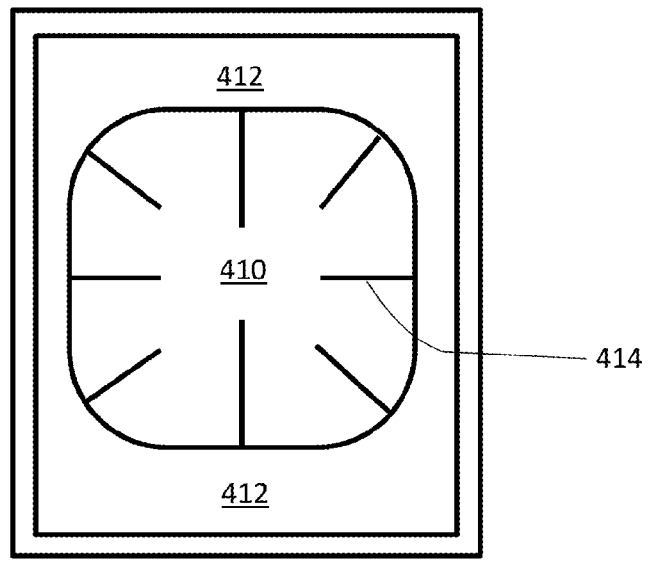
FIGS. 4A-4B are, according to one set of embodiments, schematic illustrations of mesas.

FIG. 4A is a schematic illustration outlining the components that can be included in a mesa. In FIG. 4A, mesa 410 can be formed by removing the n-type layer, the light-generating region, and/or the p-type layer from regions 412. N-type electrodes 414 can be used to make electrical contact with the emission surface of mesa 410. In addition, p-type electrodes can be located at the base of mesa 410.

Figure 4B:
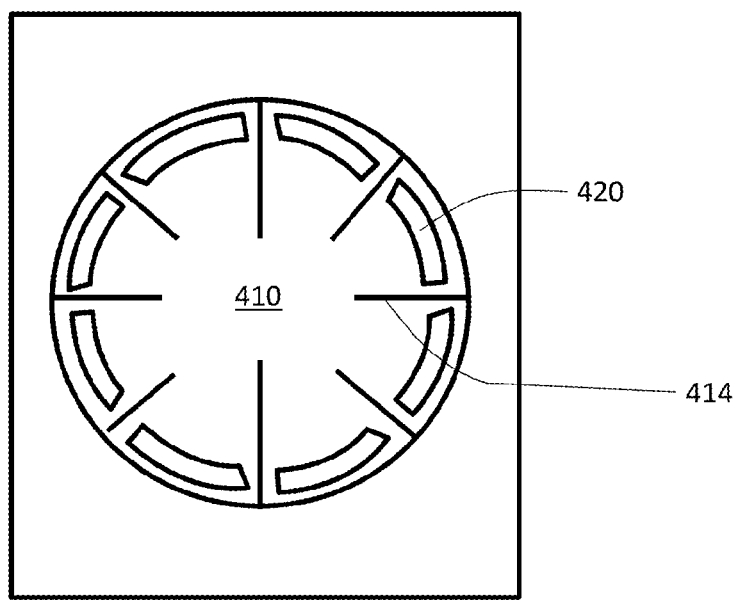

FIG. 4B is a schematic illustration of the layout of components on another mesa. In FIG. 4B, rather than removing all of the material surrounding the mesa, mesa 410 is formed by removing narrow strips 420 of the n-type layer, the light-generating region, and/or the p-type layer.

In some embodiments, the light-emitting device can be arranged such that it includes a plurality of mesas and an emission area defined by the emission surfaces of the mesas. In certain embodiments, each mesa comprises an independent light-generating region (e.g., by etching through the light-generating region in areas surrounding the mesas).

Figure 5A:
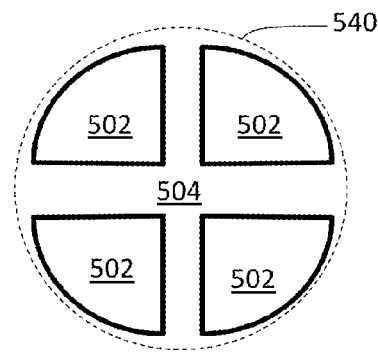
FIGS. 5A-5C are schematic diagrams illustrating various configurations of light-emitting mesas, according to some embodiments.

In certain embodiments, at least one of the mesas comprises an emission surface having a substantially circular sector shape. As used herein, the phrase "circular sector" is given its normal mathematical definition, and refers to a portion of a circle enclosed by two radii and an arc. In certain embodiments, the arc spans an angle defined by the two radii of equal to or less than about 90°. For example, FIG. 5A includes a top-view schematic illustration of a light-emitting device, according to one set of embodiments, in which a plurality of mesas 502 are arranged in four circular sectors, each circular sector comprising an arc that spans an angle of about 90° between the two radii. Mesas 502 can be formed, for example, by etching isolation regions 504 between mesas 502 (e.g., by etching the n-type layer, the light-generating region, and/or the p-type layer). In certain embodiments, an independently-addressable electrode is positioned over each of mesas 502.

Figure 5B:
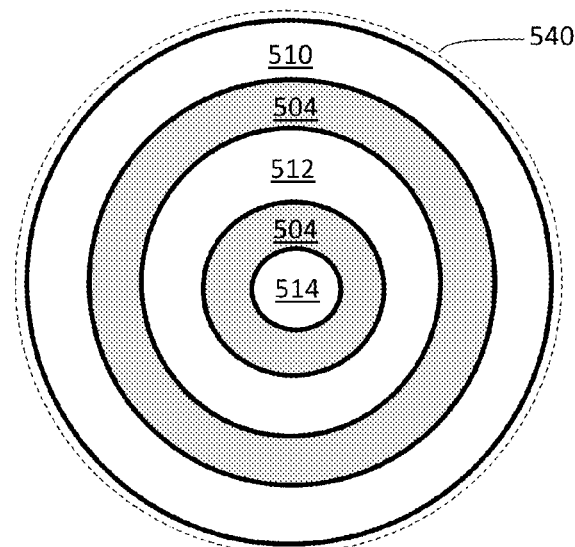

In certain embodiments, the light-emitting device can comprise a plurality of mesas in which a first mesa has an emission surface with a substantially circular perimeter, and a second mesa has an emission surface with a substantially circular perimeter and is circumscribed by the emission surface of the first mesa. For example, FIG. 5B includes a top-view schematic illustration of a light-emitting device, according to one set of embodiments, in which a mesa has been divided into such circular sections. In FIG. 5B, first mesa 510 and second mesa 512 each have an emission surface with a substantially circular perimeter. In addition, the emission surface of second mesa 512 is circumscribed by the emission surface of mesa 510. The light emitting device in FIG. 5B also includes a third mesa 514 having a circular emission surface. In FIG. 5B, the emission surface of third mesa 514 is circumscribed by the emission surfaces of mesas 510 and 512. Mesas 510, 512, and 514 can be formed, for example, by etching isolation regions 504 between the mesas (e.g., by etching the n-type layer, the light-generating region, and/or the p-type layer). In certain embodiments, an independently-addressable electrode is positioned over each of mesas 510 and 512 (and, in certain embodiment, over mesa 514).

Figure 5C:
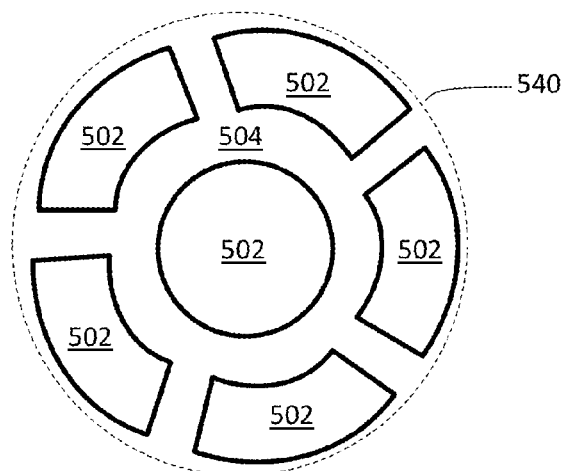

FIG. 5C includes a schematic illustration of a set of embodiments in which a mesa has been divided into a combination of pie and circular shapes. In FIG. 5C, an independently-addressable electrode can be positioned over each of mesas 502.

In some such embodiments in which the light-emitting device includes a plurality of mesas, the current distribution can be adjusted so as to allow the emission geometry to match the etendue of different optical systems. For example, an emission area can be defined by the emission surfaces of the mesas. In certain embodiments, the emission area defined by the emission surfaces of the mesas can have a non-rectangular perimeter. For example, in FIGS. 5A-5C, the emission surfaces of the mesas define an emission area having a perimeter corresponding to circle 540. In other embodiments, the perimeter of the emission area defined by the emission surfaces of the mesas can have any of the shapes described herein with respect to the emission surfaces and/or the emitter output apertures (e.g., elliptical, polygonal, etc.). In some such embodiments, the shape of the perimeter of emission area defined by the emission surfaces can substantially correspond to the shape of an input aperture in a system in which the LED is employed.

Figure 6A:
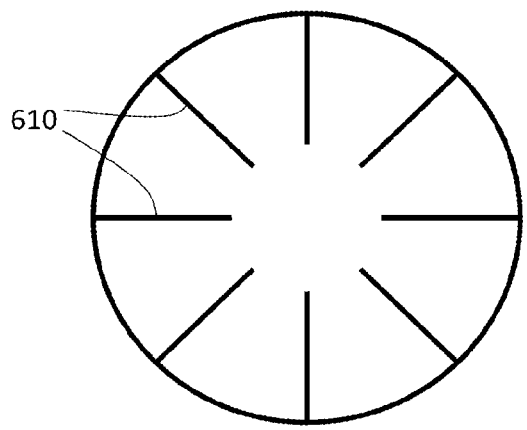
FIGS. 6A-6C are schematic diagrams outlining various electrode configurations, according to one set of embodiments.
Figure 6B:
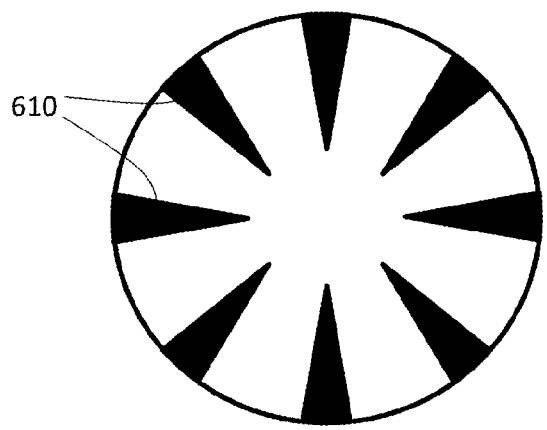
Figure 6C:
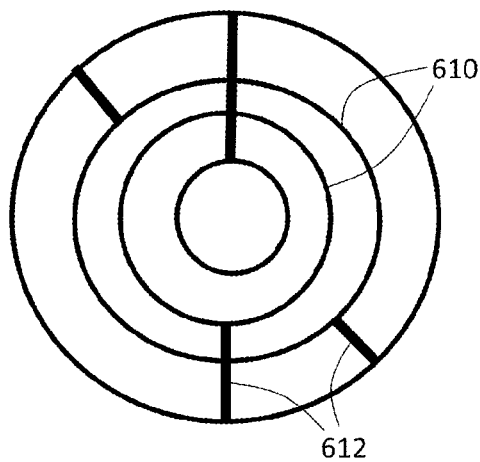

In some embodiments, the design of the top contact electrode (e.g., the n-side electrode in FIG. 2) can be modified so that it provides a desired current distribution. FIGS. 6A-6C are top-view schematic illustrations of exemplary electrode layouts that can be used in association with the embodiments described herein. In some embodiments, electrodes 610 are arranged such that they only extend part of the way toward the center of the die, as illustrated, for example, in FIG. 6A. In some embodiments, the width of electrodes 610 decreases along a direction extended toward the center of the die, as illustrated in FIG. 6B.

In some embodiments, electrodes 610 are fed from electrically isolated electrically conductive material 612 (e.g., metal) that contacts the electrodes, as illustrated in FIG. 6C. Electrically conductive material 612 can be electrically isolated, for example, by positioning a non-ohmic material between the electrically conductive material and the top surface of the LED (e.g., n-type layer 234 in FIG. 2). In some such embodiments, the isolated metal may be substantially thicker than the electrodes (e.g., at least 5 times or at least 10 times thicker) so as to reduce the voltage drop and improve current spreading. For example, the distribution metal can be electroplated, in some embodiments.

In some embodiments, the light-emitting diode can be transferred to a second substrate (e.g., a submount). In certain embodiments, the second substrate can be electrically isolated from the top side epitaxial layer (e.g., the top side n-type layer in FIG. 2). In some embodiments in which multiple segmented mesas are employed, such an arrangement can allow one to wire the mesas in series, allowing the device to operate at higher voltages.

The design of the top-side electrodes can be modified depending on the mesa design. For example, in some embodiments, individual electrode segments can be addressed without addressing other electrode segments. In some embodiments, the current flowing into the electrode segments can be adjusted to achieve a desired light output.

In some embodiments, the emission surface can include a variation in its dielectric function (e.g., the emission surface can be roughened and/or the emission surface can include a regular pattern such as a micro-structure, photonic lattice, or combination), and the variation in the dielectric function can be selectively positioned within the emission surface. By adopting this arrangement, one can increase the amount of light emitted through a non-rectangular (e.g., circular) emission surface.

In some embodiments, the light-emitting diodes described herein can be configured such that the emission surface has a relatively large emission surface area. For example, the emission surface can have an emission surface area of at least about 1 mm$^2$, at least about 5 mm$^2$, at least about 10 mm$^2$, or at least about 100 mm$^2$ in some embodiments. In certain embodiments, the surface area of the opening within the emitter output aperture can be relatively large, for example, having a surface area of at least about 1 mm$^2$, at least about 5 mm$^2$, at least about 10 mm$^2$, or at least about 100 mm$^2$.

In certain embodiments, the light-emitting diode can be configured to emit most or all of the light generated by light-generating region 230 through at least a portion of upper surface 210. Such light-emitting diodes are commonly referred to as "top-emitting" (as opposed to "side-emitting") light-emitting diodes. In certain embodiments, at least about 75%, at least about 90%, at least about 95%, at least about 99%, or substantially all of the light that is emitted by any of the light-emitting diodes described herein is emitted through the top surface (e.g., a top emission surface such as emission surface 210 in FIG. 2).

In certain embodiments, a plurality of light-emitting dies (as opposed to a single light-emitting die) can be used to define a cumulative emission area. For example, referring back to FIG. 5C, in certain embodiments, the arrangement of mesas 502 can be replaced with individual LED dies. The plurality of light-emitting dies can each comprise light-generating regions and top surfaces and can together define a cumulative emission area (e.g., indicated by circle 540 in FIG. 5C). Such an arrangement of LED dies can be used in association with any of the embodiments described herein, for example, replacing LEDs 106 described in any of FIGS. 1E-1H. In certain embodiments, a system including the plurality of LED dies can include a substantially non-rectangular emitter output aperture positioned over the top surfaces of the light-emitting dies, configured such that light emitted by the light-emitting dies is transported through the emitter output aperture. The system can further comprise an input aperture arranged to receive light generated by the light generating regions. In some such embodiments, the shape of the emitter output aperture substantially corresponds to the shape of the input aperture. The plurality of mesas can define a cumulative emission area having any desired shape, including substantially circular shapes, substantially elliptical shapes, polygonal shapes with 5 or more sides (regular or irregular), or any of the other emission area shapes described elsewhere here (e.g., with respect to emission area 106 or emitter output aperture 122).

Figure 5D:
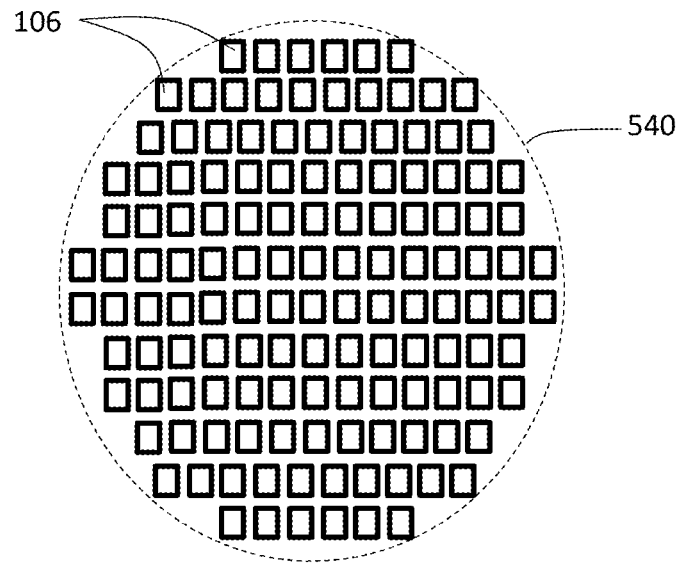
FIGS. 5D-5E are schematic illustrations of arrangements including a plurality of LED dies, according to certain embodiments.
Figure 5E:
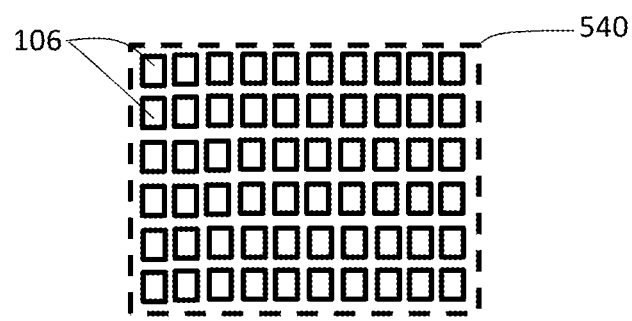

The individual dies within the plurality of dies used to establish the cumulative emission area can have any suitable shape (e.g., including substantially rectangular (e.g., substantially square) or non-rectangular (e.g., circular, elliptical, etc.)). In certain embodiments, a plurality of rectangular LED dies can be employed. The rectangular LED dies can be used to define a non-rectangular cumulative emission area. For example, in FIG. 5D, a plurality of substantially rectangular light-emitting dies 106 are arranged to define a substantially circular cumulative emission area 540. Of course, in other embodiments, the plurality of LEDs can be arranged to define a rectangular cumulative emission area, as illustrated in FIG. 5E. In some such embodiments, an emitter output aperture (e.g., having a non-rectangular shape, such as a substantially circular shape, a polygonal shape with a least 5 sides, etc.) can be placed over the plurality of LEDs, for example, to alter the shape of the light transmitted to the input aperture.

Although the description herein primarily involves the configuration of the emission surface in relation to LEDs, it is to be understood that the configurations of the invention can be used with other light-emitting devices. For example, various embodiments presented herein can also be applied to other light-emitting dies (e.g., laser diode dies) and LED dies having different structures (such as organic LEDs, also referred to as OLEDs).

The embodiments described herein can provide several advantages. For example, optical efficiency for etendue limited optical systems can be increased. In addition, improved thermal performance can be achieved by, for example, improving heat transport from unpumped areas around the emission surface. In addition, the systems described herein can exhibit relatively high optical uniformity, for example, due to circular symmetry. In addition, the systems described herein can include independently addressable annular contacts, which can be useful in electronic zoom applications.

The articles, systems, and methods described herein can be used in a variety of applications. For example, the LEDs described herein can be employed in a gobo spotlight (a system with a hard circular aperture stop ("gate") typically proceeded by a condenser element and the LED).

The LEDs described herein can be used in a profile spotlight—a system that may comprise multiple LED sources (of the same or different colors and/or chromaticities), each with its own condenser element and the output of each directed through the same circular aperture stop or "gate." This devices described herein can be particularly useful in such devices as the condenser size for a given desired beam angle becomes larger if the optic is oversized to collect all the light from a square emitter. This larger size limits the packing density of the individual LED/condenser modules which increases the crossing angle of their beams through the gate, increasing etendue.

The LEDs described herein can also be used in fiber bundle illumination systems, where fiber bundle (typically a round fiber bundle) is illuminated by an LED either by direct butt coupling or through a relay optic.

The LEDs described herein can also be useful in DMD projection displays, in which the aperture stop is the rectangular DMD chip which is designed to the desired display aspect ratio, e.g. 4×3 or 16×9. Light falling outside this stop represents optical loss and possibly reduced contrast if any of the lost light is scattered back into the output optical system.

Figure 7A:
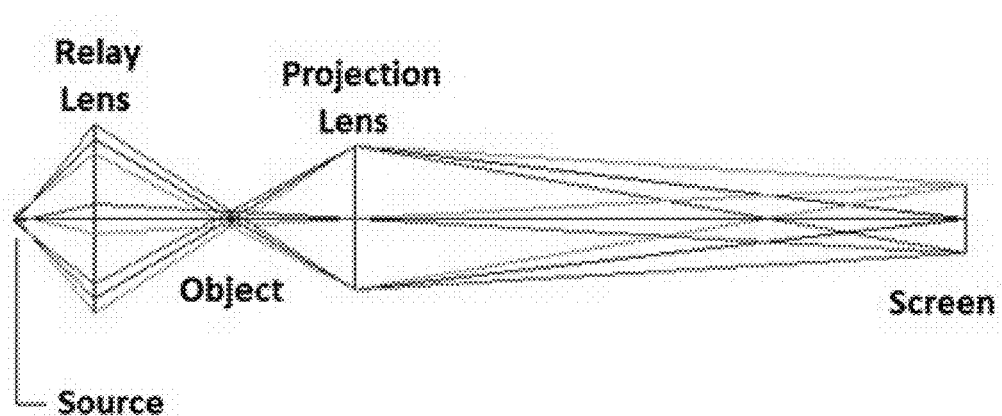
FIGS. 7A-7B are exemplary schematic illustrations of a critical illumination system, according to certain embodiments.
Figure 7B:
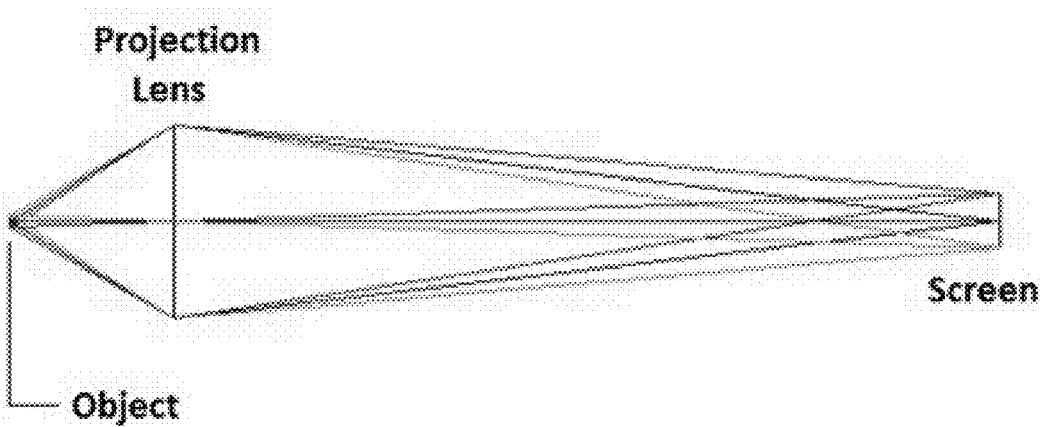

The LEDs described herein can also be particularly useful in critical illumination systems. Critical illumination systems are known to those of ordinary skill in the art. Critical illumination systems generally use a relay lens to image a light source directly on to an object that is to be illuminated. A projection lens images the object on to a screen. In a critical illumination design, the input aperture (i.e., the aperture stop) is located either at the relay lens, or at the projection lens, and limits the brightness at the screen. An exemplary schematic illustration of a critical illumination system in which the object to be imaged is located between the relay lens and the projection lens is illustrated in FIG. 7A. An exemplary schematic illustration of a portion of the critical illumination system between the object and the screen is illustrated in FIG. 7B.

In a critical illumination design, the source is imaged on to the object. The object may be square, rectangular, polygon, circular or a number of other shapes depending on the optical system. In most cases, the object forms a defined aperture through which light can pass. In certain embodiments, any of the LEDs described herein can be configured to be used in a critical illumination system such that the shape of the emission surface of the LED and/or the shape of the emitter output aperture substantially corresponds to the shape of the object that is to be imaged.

In critical illumination designs where the source uniformity is not adequate for the application, it is common practice to introduce a homogenizing optical element (such as an integrating rod or light pipe) between the relay lens and object, where the final surface of the homogenizing optical element is imaged on to the object. In certain embodiments, any of the LEDs described herein can be configured to be used in a critical illumination system in which a homogenizing optical element is employed such that the shape of the emission surface of the LED and/or the shape of the emitter output aperture substantially corresponds to the shape of the object that is to be imaged and the shape of the homogenizing optical element.

Figure 8A:
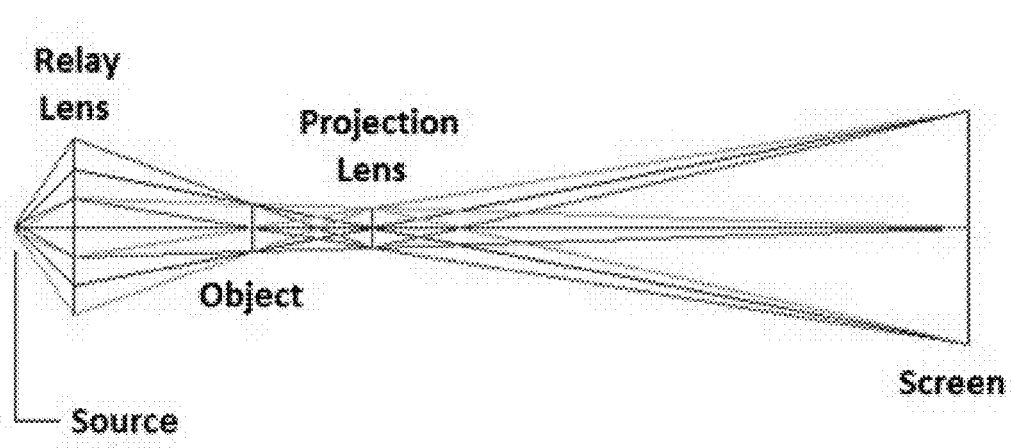
FIGS. 8A-8B are exemplary schematic illustrations of a Kohler illumination system, according to certain embodiments.
Figure 8B:
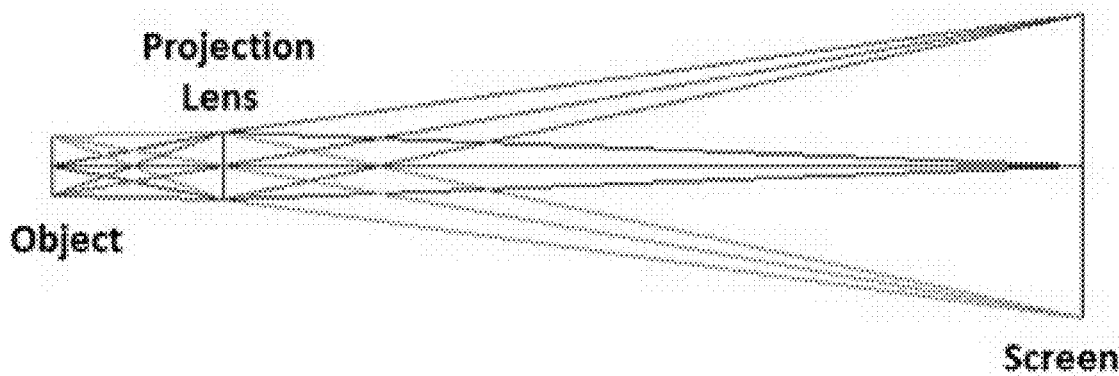

The LEDs described herein can also be particularly useful in Kohler illumination systems. Kohler illumination systems are known to those of ordinary skill in the art. Generally, Kohler illumination uses a relay lens to image a source of light onto the pupil of a projection lens, which images the object on to a screen. The object to be illuminated is positioned between the relay lens and projection lens. In a Kohler illumination design, the input aperture (i.e., the aperture stop) is located at the object, and limits the brightness at the screen. An exemplary schematic illustration of a Kohler illumination system is illustrated in FIG. 8A. FIG. 8B is a schematic illustration of a portion of a Kohler illumination system from the projection lens to the screen.

In certain embodiments, any of the LEDs described herein can be configured to be used in a Kohler illumination system such that the shape of the emission surface of the LED and/or the shape of the emitter output aperture substantially corresponds to the shape of the object that is to be imaged.

In a Kohler illumination design, the light source is imaged on to the pupil of the projection lens. The object resides in a plane located between the relay lens and projection lens. Since the location of the object does not coincide with the second focus of the relay lens, the shape of the illumination at the object plane does not depend on the shape of the source, and the shape of the illumination at the object plane will not necessarily have the same shape as that of the source.

In many optical systems it is advantageous to create the smallest volumetric design that achieves a given brightness level. To achieve the highest efficiency for the transfer of light through a Kohler illumination system with optical elements of a given size, the source's radial dimensions generally should be as small as possible.

As used herein, when a structure (e.g., layer, region) is referred to as being "on", "over" "overlying" or "supported by" another structure, it can be directly on the structure, or an intervening structure (e.g., layer, region) also may be present. A structure that is "directly on" or "in contact with" another structure means that no intervening structure is present.

EXAMPLE 1

This example describes an optical simulation of a critical illumination system. In this example, the source was defined as a square (1:1 aspect ratio) LED with an emission area of 1 mm². In the simulation, the LED was imaged on to an object defined as a circular aperture with an area of 1 mm². In a perfect optical system with a magnification of 1, the maximum efficiency with which the source is transmitted through the object is the defined by the percentage of the area of the source that resides within the boundaries defined by the object, as illustrated in FIG. 7C.

Figure 7C:
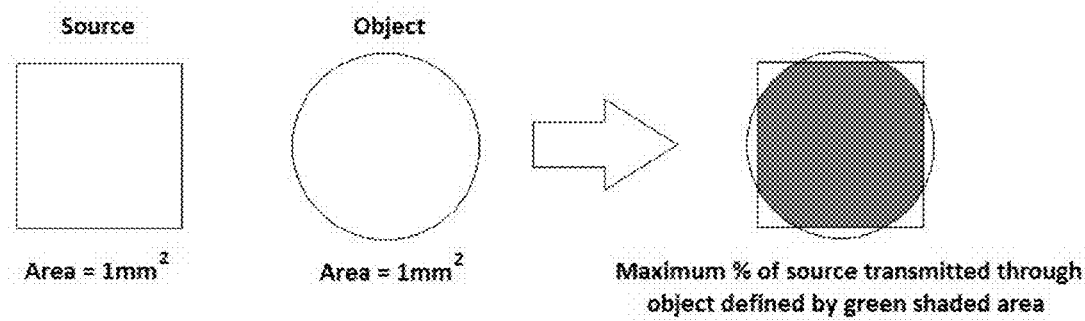
FIGS. 7C-7D are schematic illustrations of a simulated critical illumination system, according to some embodiments.

For the system illustrated in FIG. 7C, the transmission efficiency can be increased by either decreasing the size of the source or increasing the size of the object. Neither option is generally a desirable solution for the following reasons. If the source size is decreased, the luminous flux from the source will be decreased, thereby reducing the brightness of the projected image. Additionally, if the source size is decreased, the area of the object that is not illuminated will increase, thereby increasing non-uniformity in the projected image.

In this example, if the size of the object is increased, the area of the object that is not illuminated will increase, thereby increasing non-uniformity in the projected image. Additionally, if the size of the object is increased, the size of the projection lens required to collect the same amount of light will increase, thereby increasing the size of the optical system. The most efficient transfer of light from the source through the object will occur if the shape of the source and object are the same.

Figure 7D:
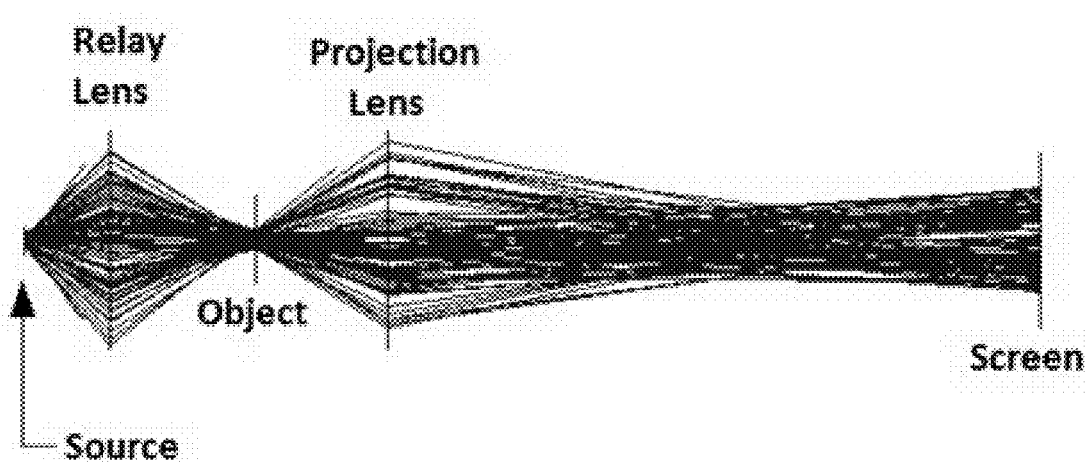

Using ZEMAX optical software to build a non-sequential optical system, as illustrated in FIG. 7D, several conditions of varied source shape and object size were analyzed to determine both relative light transfer efficiency and shape of projected image. In all of the following cases, the source size remained constant.

Figure 7E:
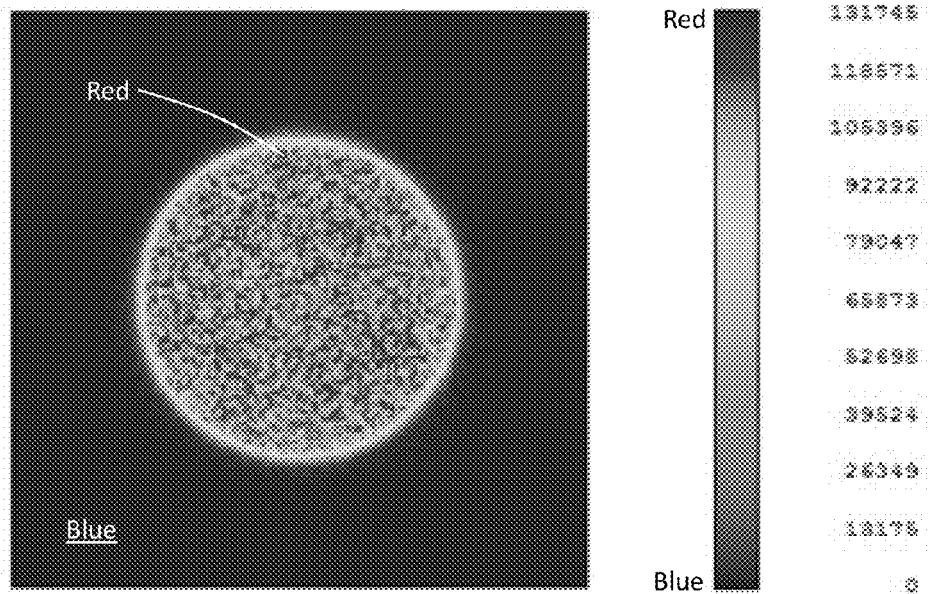
FIGS. 7E-7P are, according to certain embodiments, exemplary simulated images illustrating the intensity and shape of light at various points in simulated critical illumination systems.
Figure 7F:
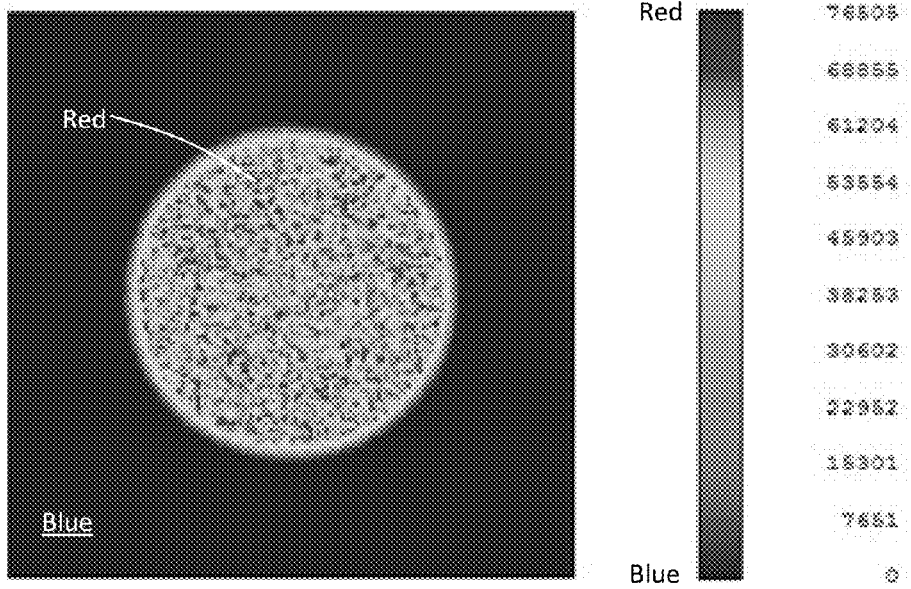
Figure 7G:
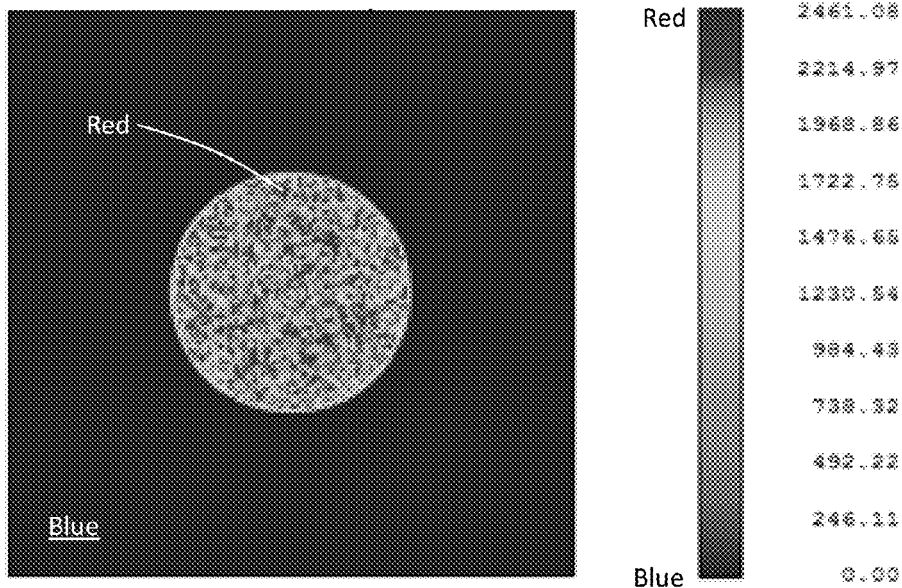

Case 1:

In the first case, the source was round and the object was round, with the source area equal to object area. The transfer efficiency of light from source through object was 1.0. FIG. 7E is a simulated image of the light at the source, FIG. 7F is a simulated image of the light at the object, and FIG. 7G is a simulated image of the light at the screen.

Figure 7H:
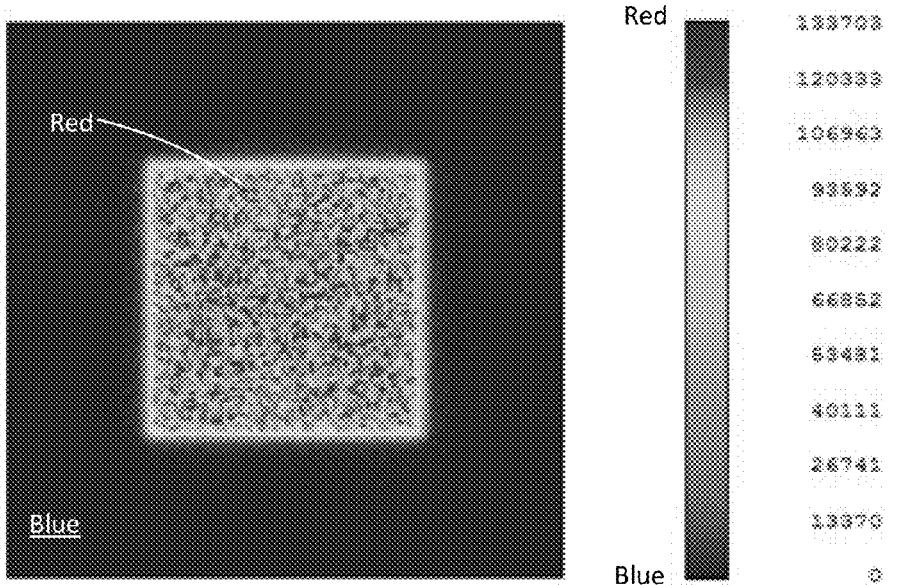
Figure 7I:
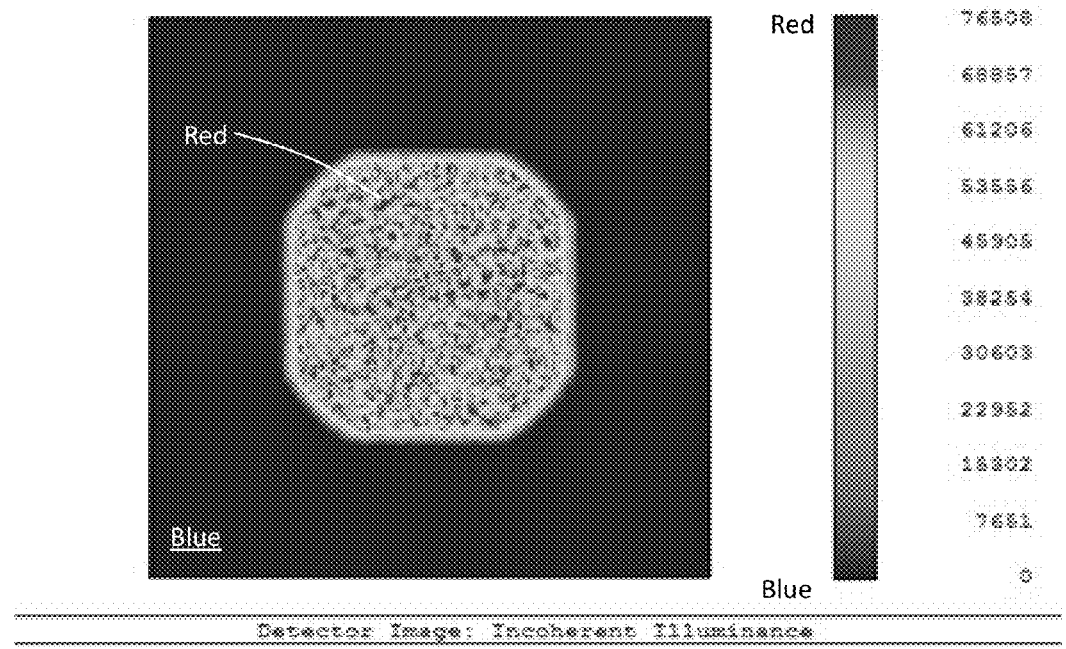
Figure 7J:
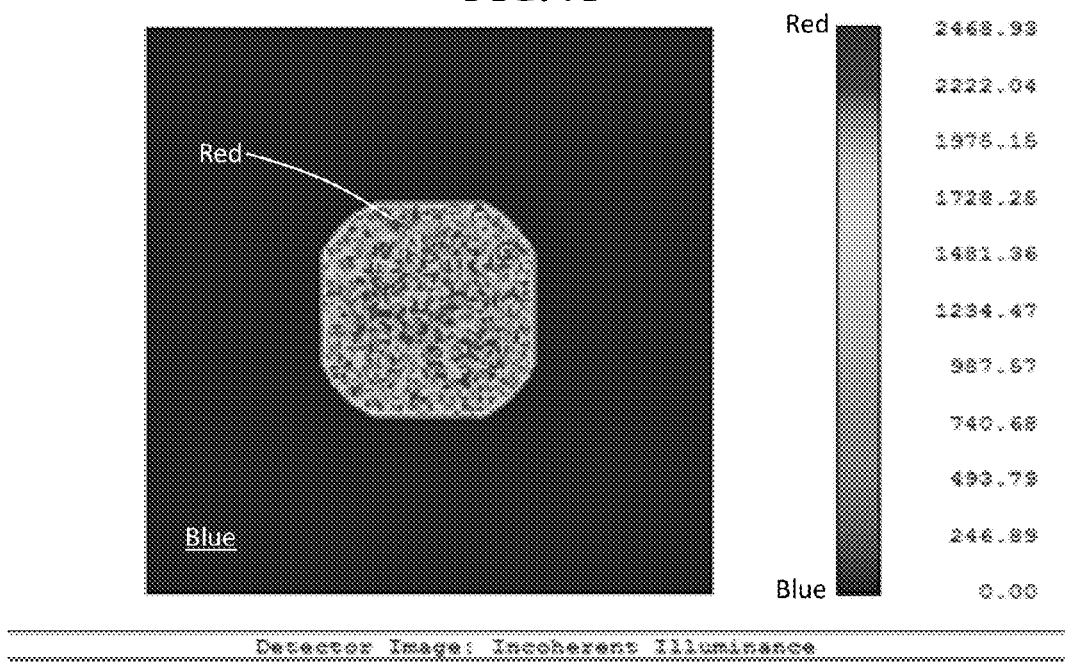

Case 2:

In the second simulated case, the source was square and the object was round, with the source area equal to object area. The transfer efficiency of light from the source through the object was 0.91. FIG. 7H is a simulated image of the light at the source, FIG. 7I is a simulated image of the light at the object, and FIG. 7J is a simulated image of the light at the screen.

Figure 7K:
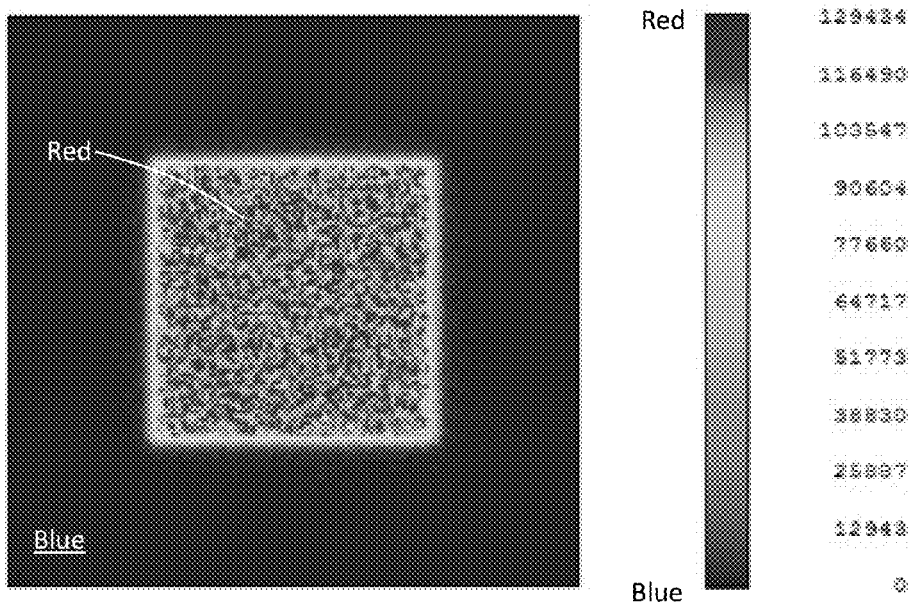
Figure 7L:
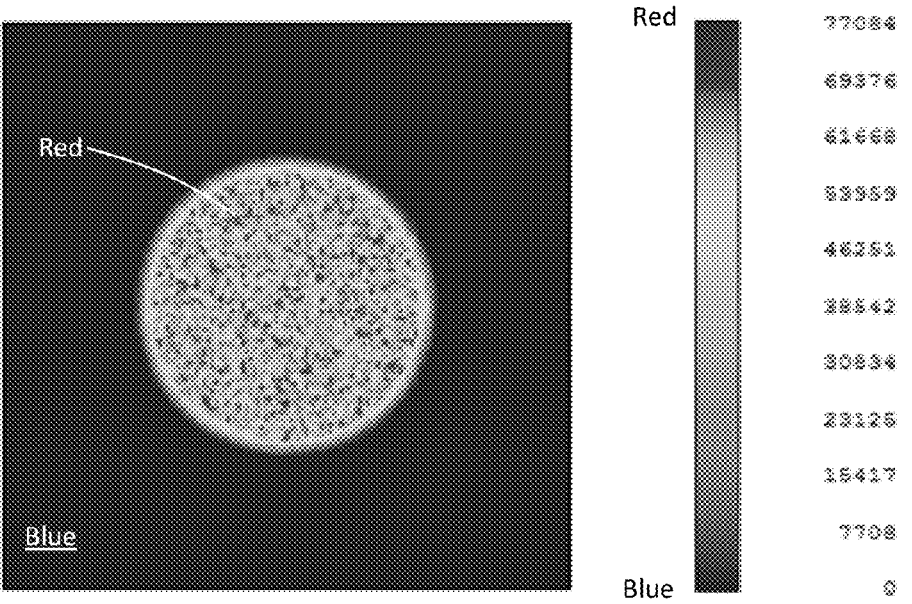
Figure 7M:
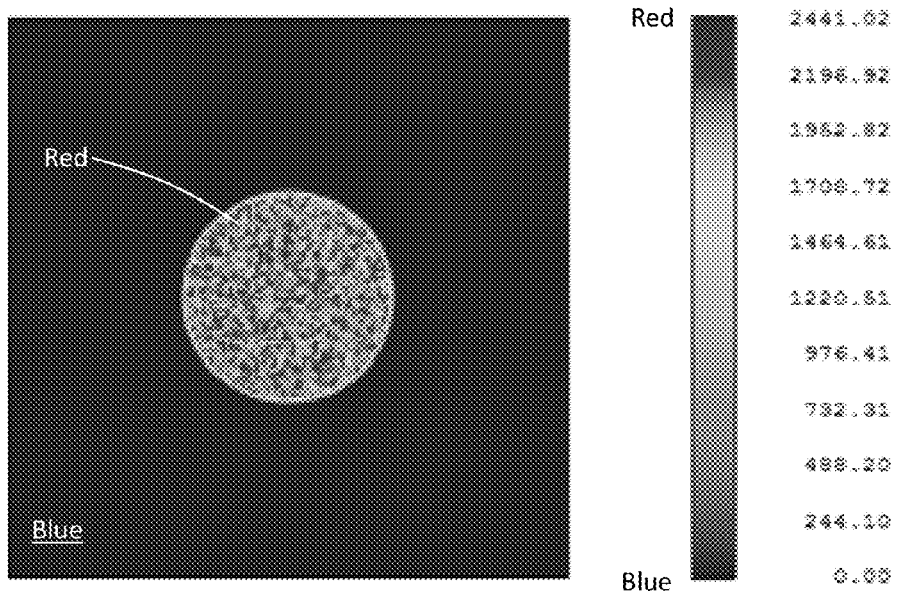

Case 3:

In the third simulated case, the source was square and the object was round, and the source area was configured to completely fill the object area. The resulting transfer efficiency of light from source through object was 0.79. FIG. 7K is a simulated image of the light at the source, FIG. 7L is a simulated image of the light at the object, and FIG. 7M is a simulated image of the light at the screen.

Figure 7N:
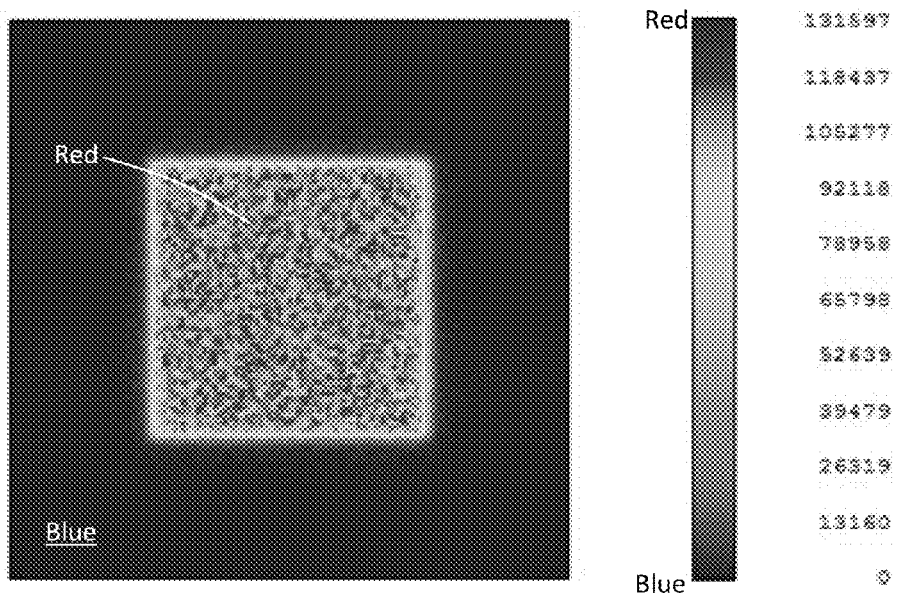
Figure 7O:
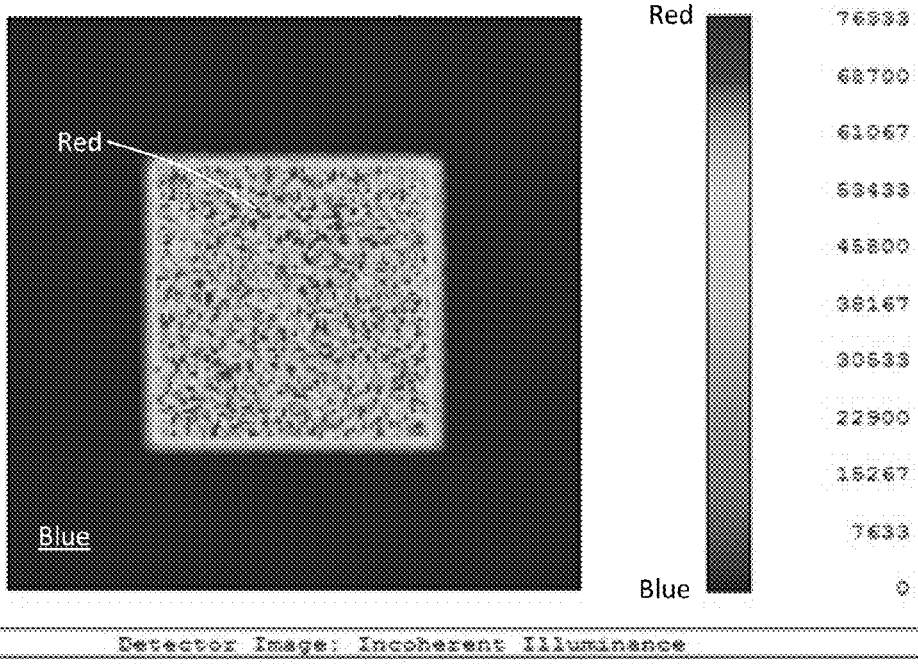
Figure 7P:
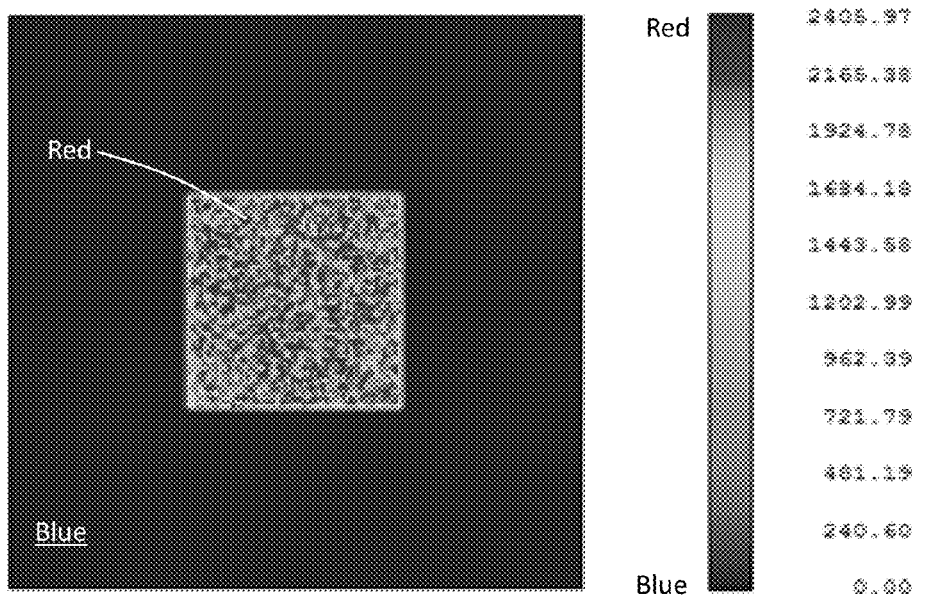

Case 4:

In the fourth simulated case, the source was square and the object was round, with the source area contained within the object area. The resulting transfer efficiency of light from the source through the object was 1.0. FIG. 7N is a simulated image of the light at the source, FIG. 7O is a simulated image of the light at the object, and FIG. 7P is a simulated image of the light at the screen.

EXAMPLE 2

Figure 8C:
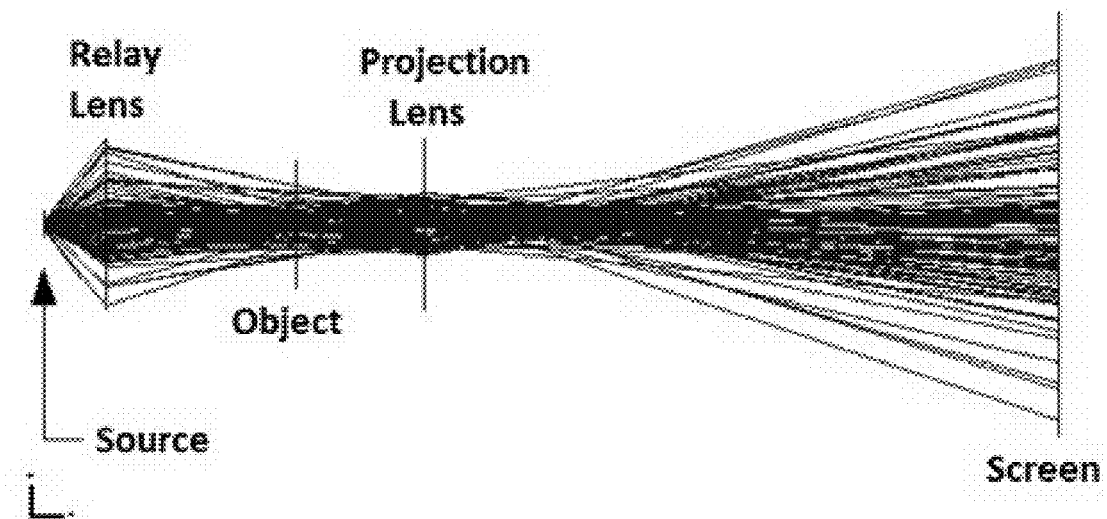
FIG. 8C is a schematic illustration of a simulated Kohler illumination system, according to some embodiments.

This example describes an optical simulation of a Kohler illumination system. Using ZEMAX optical software to build a non-sequential optical system as illustrated in FIG. 8C, the source shape was varied and compared with the illumination at the object plane and at the pupil of the projection lens. In all of the simulated cases described below, the source size remains constant.

Figure 8D:
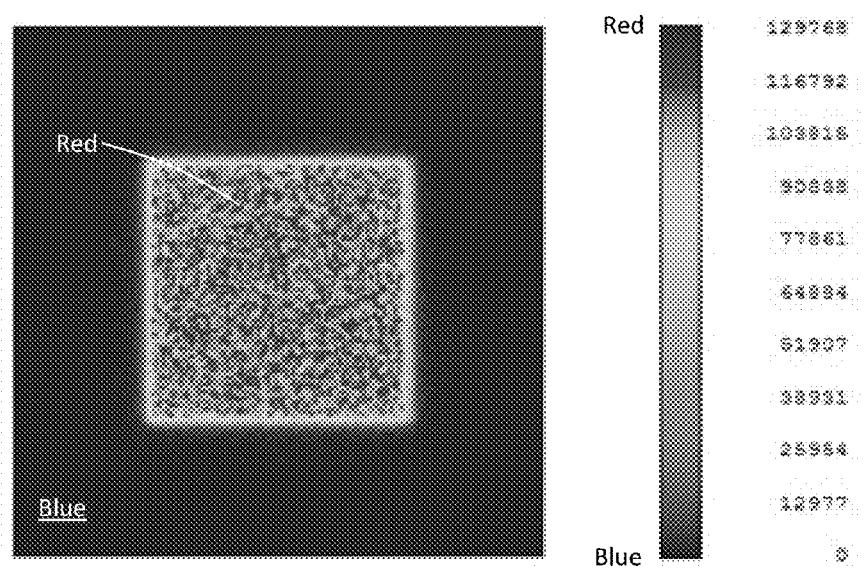
FIGS. 8D-8I are, according to certain embodiments, exemplary simulated images illustrating the intensity and shape of light at various points in simulated Kohler illumination systems.
Figure 8E:
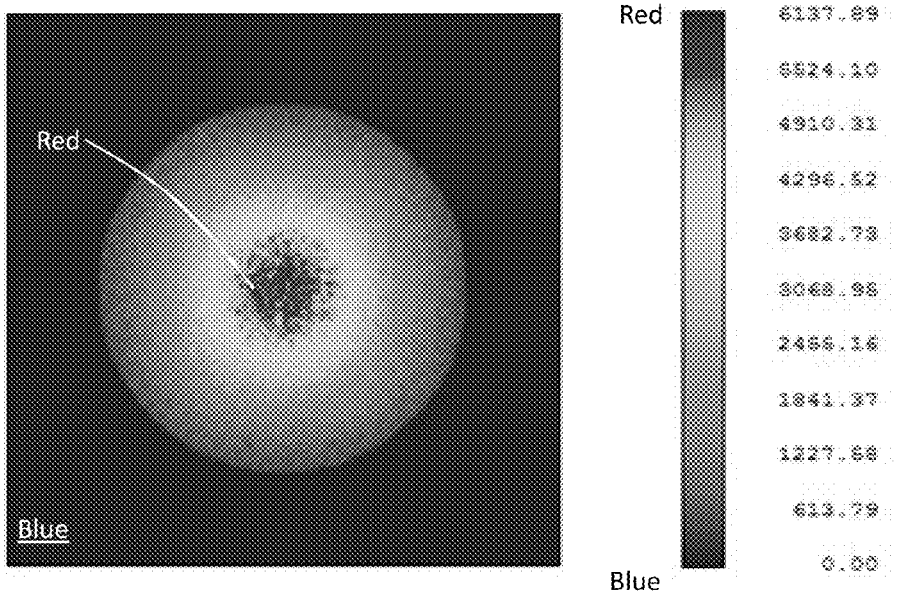
Figure 8F:
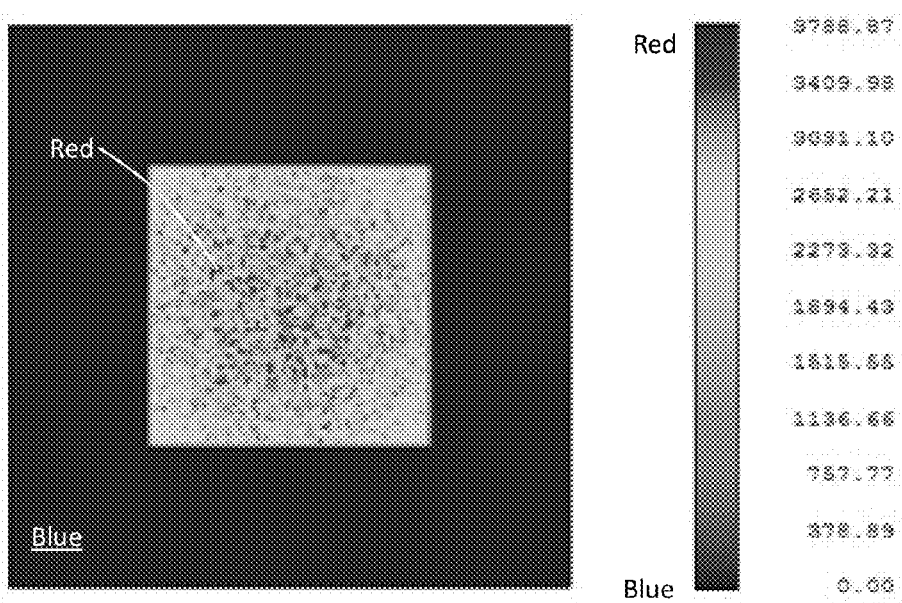

Case 1:

In the first simulated case, the source was square in shape. FIG. 8D is a simulated image of the light at the source, FIG. 8E is a simulated image of the light at the object, and FIG. 8F is a simulated image of the light at the projection lens pupil.

Figure 8G:
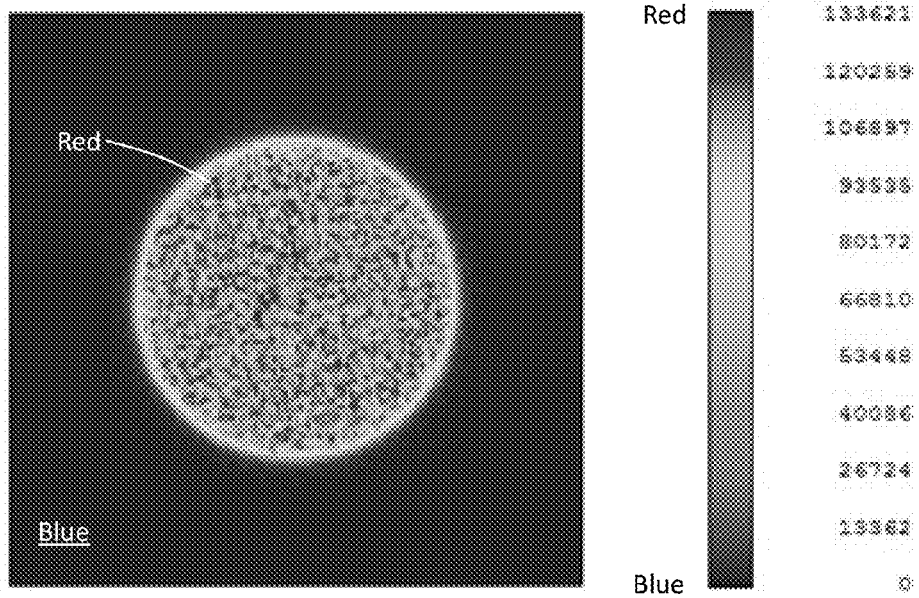
Figure 8H:
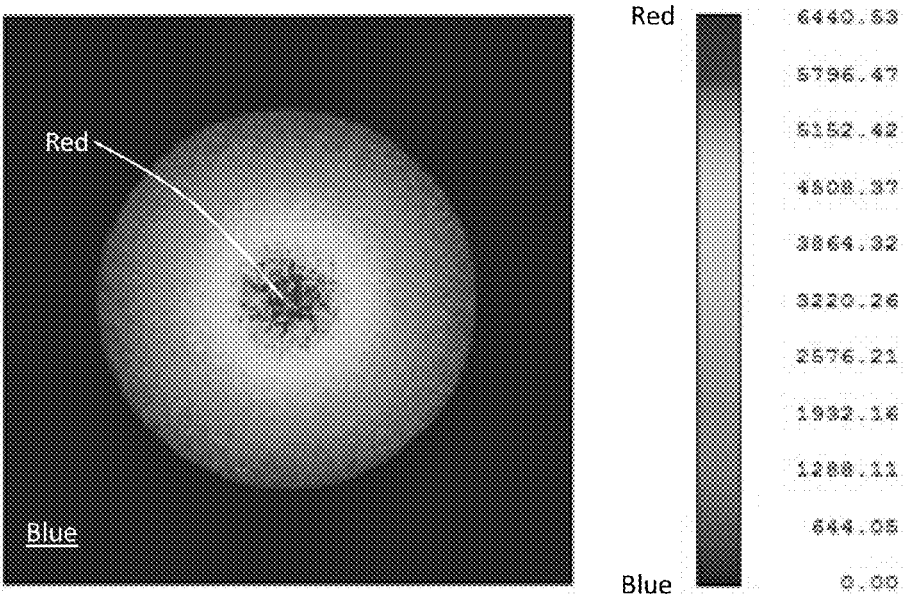
Figure 8I:
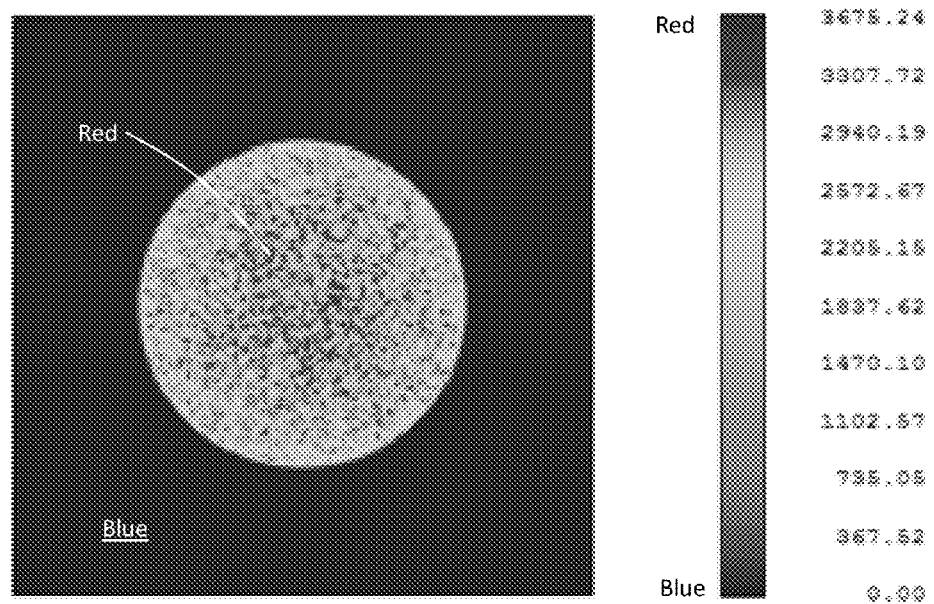

Case 2:

In the second simulated case, the source was round in shape. FIG. 8G is a simulated image of the light at the source, FIG. 8H is a simulated image of the light at the object, and FIG. 8I is a simulated image of the light at the projection lens pupil.

U.S. Provisional Patent Application Ser. No. 61/502,130, filed Jun. 28, 2011, and entitled "Light-Emitting Diode Architectures for Enhanced Performance" is incorporated herein by reference in its entirety for all purposes.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

What is claimed is:

1. A light-emitting device, comprising:
a light-emitting diode (LED) comprising a light-generating region and an emission surface configured to emit light from the light-emitting diode,
wherein the device is configured to selectively activate a portion of the light-generating region to produce a non-rectangular active emission area during use and
wherein the emission surface comprises a doped region having an electrical conductivity reduced as compared to other regions of the emission surface, the doped region configured to inhibit the transport of electrons through the emission surface and defining at least a portion of the boundary of the non-rectangular active emission area.

2. A light-emitting device as in claim 1, wherein the light-emitting die is substantially rectangular.

3. A light-emitting device as in claim 1, wherein the shape of the perimeter of the emission area is substantially circular.

4. A light-emitting device as in claim 1, wherein the shape of the perimeter of the emission area is a polygon with at least 5 sides.

5. A light-emitting device as in claim 1, wherein the shape of the perimeter of the emission area is substantially a regular polygon.

6. A light-emitting device as in claim 1, wherein the emission area has a surface area of at least about 1 $mm^2$.

7. An optical system, comprising:
the light emitting device of claim 1; and
a substantially non-rectangular emitter output aperture positioned over and separated from the light-emitting diode configured such that light emitted by the light-emitting device is transported through the emitter output aperture; and
an input aperture arranged to receive light generated by the light generating region,
wherein the shape of the emitter output aperture substantially corresponds to the shape of the input aperture.

8. An optical system as in claim 7, wherein the light-emitting die is a rectangular light-emitting die.

9. An optical system as in claim 7, wherein the input aperture comprises an optically transparent hole within an opaque material.

10. An optical system as in claim 7, wherein the input aperture comprises a microdisplay.

11. An optical system as in claim 7, wherein the shapes of the emitter output aperture and the input aperture are substantially circular.

12. An optical system as in claim 7, wherein the shapes of the emitter output aperture and the input aperture are polygons with at least 5 sides.

13. An optical system as in claim 7, wherein the emitter output aperture comprises an optically transparent hole within an opaque packaging layer.

14. An optical system as in claim 7, wherein the emitter output aperture has a surface area of at least about 1 $mm^2$.

15. An optical system as in claim 7, wherein the shortest distance between the emitter output aperture and the light-emitting die is less than about 1 centimeter.

* * * * *